United States Patent [19]

Mangano et al.

[11] Patent Number: 5,404,021

[45] Date of Patent: Apr. 4, 1995

[54] LASER SENSOR FOR DETECTING THE EXTENDED STATE OF AN OBJECT IN CONTINUOUS MOTION

[75] Inventors: Nicholas O. Mangano, Bloomington; John Wachli, Rancho Palos Verdes, both of Calif.

[73] Assignee: Excellon Automation, Torrance, Calif.

[21] Appl. No.: 45,803

[22] Filed: Apr. 9, 1993

Related U.S. Application Data

[63] Continuation-in-part of Ser. No. 791,416, Nov. 13, 1991, Pat. No. 5,212,391.

[51] Int. Cl.⁶ .................................................. G01N 21/86
[52] U.S. Cl. ........................................ 250/561; 356/375
[58] Field of Search ............... 250/560, 561, 562, 563, 250/223 R; 356/375, 376; 324/175; 901/41, 47

[56] References Cited

U.S. PATENT DOCUMENTS

| | | | |
|---|---|---|---|
| 4,301,373 | 11/1981 | Sjödin | 250/560 |
| 4,340,326 | 7/1982 | Buonauro et al. | |
| 4,343,553 | 8/1982 | Nakagawa et al. | 250/560 |
| 4,613,812 | 9/1986 | Gelston, II | |
| 4,623,797 | 11/1986 | Eaton et al. | 250/560 |
| 4,654,523 | 3/1987 | Tanaka et al. | |
| 4,657,395 | 4/1987 | Shiraishi et al. | |
| 4,667,113 | 5/1987 | Nakajima et al. | |
| 5,005,978 | 4/1978 | Skunes et al. | |

FOREIGN PATENT DOCUMENTS

| | | |
|---|---|---|
| 0493908 | 8/1992 | European Pat. Off. |
| 0554614 | 11/1993 | European Pat. Off. |
| 4141141 | 6/1993 | Germany |
| 9002022 | 8/1990 | WIPO |

OTHER PUBLICATIONS

Broken Tool Indicator Service Manual, Rev. C, Excellon Automation, Torrance, Calif., Jul. 1987, pp. 2-1, 4-1 to 4-3.

*Primary Examiner*—David C. Nelms
*Attorney, Agent, or Firm*—Knobbe, Martens, Olson & Bear

[57] ABSTRACT

A non-contact, laser detection system for detecting the extended state of an object in continuous motion such as a drill bit. For detecting the state of sufficient or insufficient flute length of the drill bit, the drill bit is moved in relation to the laser detection system until energy reflected from the tip of the drill bit is detected. Then, the drill bit is moved in relation to the laser detection system a pre-selected distance from the point at which the tip was initially detected, to a second point where the energy reflected from the drill bit is analyzed by a computer to determine if the laser is still incident on the fluted section of the drill bit. If the computer determines that the laser is still incident on the fluted section, then the flute length of the drill bit is at least as long as the preselected distance.

35 Claims, 9 Drawing Sheets

Microfiche Appendix Included
(1 Microfiche, 8 Pages)

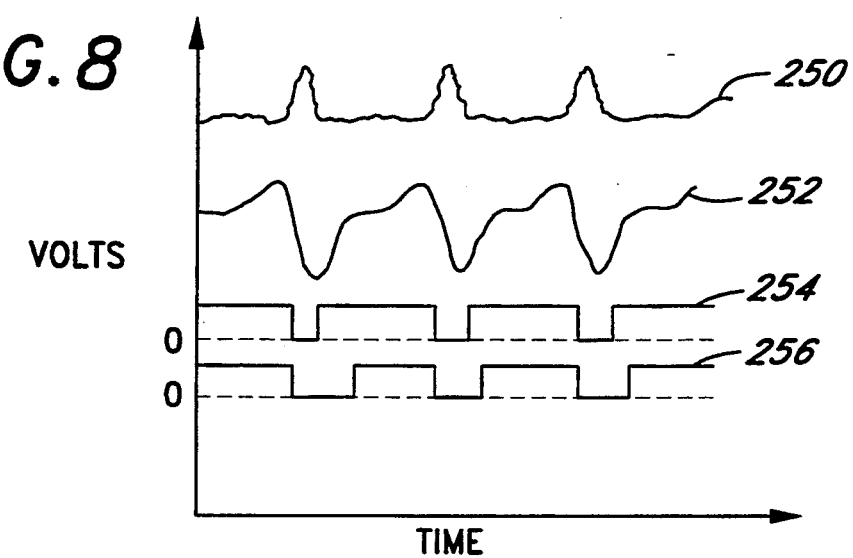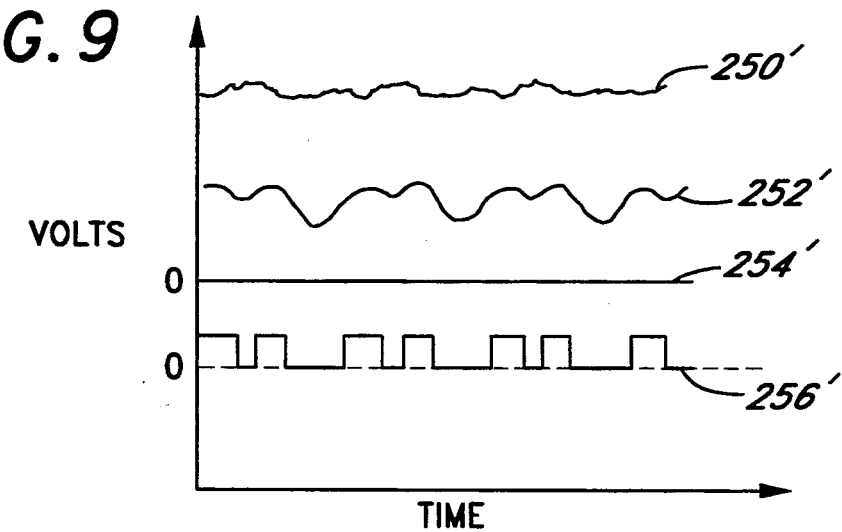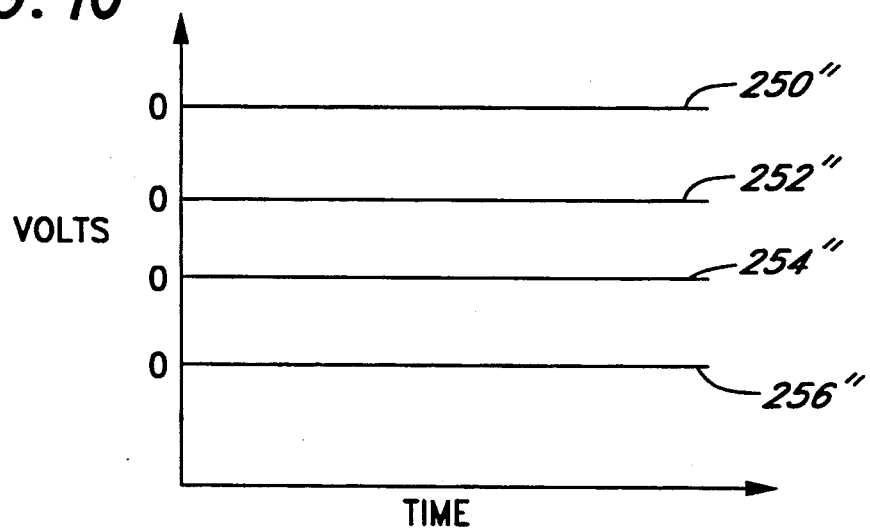

LASER SENSOR FOR DETECTING THE EXTENDED STATE OF AN OBJECT IN CONTINUOUS MOTION

RELATED APPLICATIONS

The present application is a continuation-in-part of application U.S. Ser. No. 07/791,416, filed Nov. 13, 1991, now U.S. Pat. No. 5,212,391, entitled "Laser Sensor For Detecting The Extended State Of An Object In Continuous Motion".

MICROFICHE APPENDIX

A microfiche appendix containing computer source code is attached. The microfiche appendix comprises one (1) sheet of microfiche having 8 frames, including one title frame.

The microfiche appendix contains material which is subject to copyright protection. The copyright owner has no objection to the reproduction of such material, as it appears in the files of the Patent and Trademark Office, but otherwise reserves all copyright rights whatsoever.

BACKGROUND OF THE INVENTION

1. Field of the Invention

The present invention relates to industrial type non-contact detection systems for ascertaining the state of an object in a machine system. More specifically, the present invention relates to a laser detection system for ascertaining the state of rotating objects or objects in some other continuous repetitive motion.

2. Description of the Prior Art

The development of machinery for automated manufacturing has produced many benefits to mankind. More specifically, today, the manufacture of most consumer and industrial electronic instruments and appliances is largely automated. During the manufacture of electronics boards, holes must be precisely drilled in a circuit board for interconnecting circuits on the board and for fastening the boards to a chassis. For this purpose, high speed, computerized drilling machines rapidly position the board, hold it in place, and drill the necessary holes.

However, problems arise when a drill bit breaks during the drilling operation and the broken bit goes undetected. If the broken bit is not detected, the drilling machine will attempt to continue drilling holes with serious consequences. On the one hand, if the drill breakage occurs only a small distance from the tip of the bit, the drilling machine will continue to drill with the damaged drill bit, thus destroying the board or, at best, producing unacceptably poor quality holes and, in either case, this may require the defective circuit board to be discarded. On the other hand, if the drill breakage occurs at a greater distance from the drill tip, the resultant circuit board will lack holes which were to be created in the drilling process subsequent to the bit being damaged. A defective board lacking one or more holes may be recognized during a post-inspection process and the missing holes may be drilled. However, this corrective procedure causes a significant reduction in productivity.

While non-contact systems for detecting broken bits are presently available, conventional non-contact systems are typically highly affected by environmental conditions and are unable to be conveniently located on the drilling system. Presently known non-contact detection systems include those using light emitting diode (LED) or microwave technologies, both of which are highly susceptible to environmental conditions. These non-contact detection systems do not utilize the benefits of the continuous repetitive movement of the object to eliminate error, interference and the effects of harsh changing environmental conditions.

Also, many available detectors are required to be located very close to the object and at an angle normal to the objects motion. Generally, this is a poor location and subjects the detection device to difficult operating conditions. In a drilling machine operation, the traditional light detection systems must be placed in a ballistic path of the debris generated by the drill increasing interferences and device errors.

LED detection systems utilize the principle of light occlusion thus requiring the object being detected to be directly in the path of the light. On drilling systems, this necessitates the full retraction of the drill bit into a pressure foot assembly. This full retraction after each hole is drilled greatly decreases the efficiency of the drilling machine. Also, such a system must detect small fractional signal changes, particularly for drills with smaller diameters. However, the resulting LED, or occlusion, system has a relatively low signal-to-noise ratio making such signal ranges difficult to detect.

Non-contact microwave detection systems operate on the principle that the presence of a continuous target, such as a fine drill, in or near the end of the waveguide at a predetermined location produces a change in the standing wave ratio (SWR) of the transmitted signal. This change in the SWR is capable of being detected by a receiver to provide a signal that is indicative of the target condition. These microwave systems do not operate using the Doppler principle of measured frequency change; rather, only the DC component of the signal is utilized by such detection systems. Hence, the frequency components of the output signal are not used.

The creation of a resonant microwave cavity and the detection of objects entering the cavity by a change in the SWR is affected by nearly any foreign object entering the resonant cavity. Thus, such a system is prone to interference from airborne debris. The microwave detection systems are also subject to interference from the copper shavings produced during the drilling of copper layers in printed circuit boards, known as "drill-wrap", and system to system variations.

In addition, all elements in or surrounding the microwave cavity must remain constant. The components making up the cavity cannot be moved without making changes or adjustment to the microwave detection device. The microwave detection system is not easily adaptable from system to system and adjustments or variations may be needed depending on the objects in and around the cavity created by each host system.

The microwave detection systems produce small signal changes from the object-present state to the object-not-present state which are analyzed by the system's comparator. Using a small signal change greatly increases the possibility of error by the microwave system.

In addition to the aforesaid disadvantages of the presently known drill bit detections systems, these systems do not detect when a drill bit is clogged. Because of the environmental affects on LED detection systems, and the resulting low signal-to-noise ratio, it is difficult to obtain a signal that is measurably indicative of the varying reflectivity of a spinning drill bit. It will also be appreciated that the present microwave systems utilize only the DC component of the reflected signal and, therefore, do not take into account the frequency of the reflected signal.

Many of the disadvantages of the LED and microwave systems have been overcome by the advent of a laser detection system which detects fluctuating light reflected from a drill bit. Such a laser detection system is presently included in the Concept 1 & 4, MVI and MVII drilling machines manufactured by Excellon Automation of Torrance, Calif. Nevertheless, while the present laser detection system is advantageous for detecting the presence or absence of a drill bit, it does not detect whether a drill bit is clogged.

A drill bit may be become clogged, for example, when "green" printed circuit boards are being drilled. Circuit boards are typically formed from an epoxy resin material which must be cured. Therefore, a green, or incompletely cured, board contains tacky material that may stick to the drill bit during drilling. A drill bit may also become clogged when the feed rate of the drill bit is too low. That is, if the axial motion of the bit through the work is too slow, the drill bit will heat up, heating surrounding board material by conduction, and again providing a means for tacky material to be deposited in the flutes of the drill bit. A clogged bit has a reduced reflective surface area that causes the present laser detection system to sometimes indicate that the drill bit is broken. Regardless of how material is deposited in the flutes, it is often important to distinguish between a clogged drill bit and a broken drill bit.

In general, when a drill bit breaks, the drilling of a circuit board must stop until the drill bit is replaced. On the other hand, when a drill bit is clogged, the drilling process need not necessarily stop. Oftentimes, the drill bit will clog but it is unnecessary to clean the drill bit until many boards have been drilled. Therefore, if the bit detection system cannot distinguish between whether a bit is broken or just clogged, drilling time is lost due to unnecessary delays in checking clogged bits. It is also vital to provide the user of the drilling machine with the option of either stopping the machine or continuing the drilling.

The needs for broken and clogged drill bit detection have been addressed by the invention disclosed in the copending U.S. application Ser. No. 07/791,416.

A further disadvantage of LED and microwave systems, as well as the aforementioned laser detection systems, such as those included in Excellon Automation's Concept 1 & 4, MVI and MVII drilling machines, is that they are not able to determine whether the drill bit currently being used has a sufficient flute length for a particular drilling operation. In some drilling applications, where the holes drilled must be of an exact depth, such as drilling circuit boards, the drill bits used must have flutes extending along the drill bit for a specified length to be able to drill these holes to the exact depth required.

Drill bits used for drilling holes in circuit boards typically include a tip, with a cutting surface, a fluted section, and a shank section. The tip and cutting surface is used to actually bore the hole into the circuit board. The tip and cutting surface is then followed by a fluted section, having a diameter roughly equal to or less than the diameter of the cutting section, which is used to remove material bored by the cutting surface from the hole. At the end of the fluted section opposite the tip, the drill bit includes a shank section which typically has a larger diameter than the fluted section to permit the shank to be retained by the collet of the drilling machine during drilling operations.

If the drill bit is used to drill a hole which is deeper than the length of the fluted section of the drill bit, the larger diameter shank section will then come into contact with the upper surface of the material being drilled when the drill bit has bored a hole along the full length of its fluted section. This may result in damage to the material being drilled. For example, if the larger diameter shank section of a drill bit comes into contact with the upper surface of a circuit board during drilling, the circuit board is likely to be ruined as the shank section will typically bore a hole in the upper surface of the circuit board with a diameter which is substantially larger than the diameter that was intended. An additional problem that often results when the shank section of a drill bit, particularly a small drill bit, e.g., having a diameter of 0.0020 inches, makes contact with the upper surface of a current board is that the drill bits will often break as a result of the additional stresses placed on them.

The problems stemming from a drill bit having insufficient flute length usually result from either the operator of a drilling machine placing the wrong drill bit into the collet of the drilling machine or, in automated drilling applications, the drilling machine selecting the wrong sized drill bit. While drill bits are often marked or otherwise identified so that an operator or a machine can select the appropriate drill bit, these markings are often not reflective of the true flute length of the drill bit. Specifically, when the cutting surfaces of drill bits are sharpened, a small portion of the fluted section of the drill bit is often ground away. Repeated sharpening of a drill bit can result in an appreciable decrease in the flute length of a drill bit from the marked value of the flute length. Consequently, even though the operator or the automated drilling machine is selecting an appropriately marked drill bit, the flute length of the drill bit may still be insufficient for a specific drilling operation.

Heretofore, the flute length of a drill bit was typically verified by off-line measurements of the drill bit. However, many drill bits are very small which makes measurement of the lengths of the flutes by conventional means very difficult. Further, in automated drilling applications, off-line measurement of drill bits intended to be used in an automated drilling sequence would result in a substantial reduction in the efficiency of the automated drilling machine.

Consequently a need exists for a drill bit detection system which will quickly measure a drill bit to ensure that it has a sufficient flute length to drill holes of the intended depth. Further, a need exists for a drill bit detection system which can measure the flute length of a drill bit on-line as part of the automated drilling sequence of an automated drilling machine.

Summary of the Invention

The present invention, which satisfies the aforementioned needs, includes a non-contact laser detection system which detects fluctuating light reflected from an object in continuous motion and determines the extended state of the object. The system is particularly useful for detecting the state of a particular tool or portion thereof in an automated machine, thereby providing the capability to detect breakage of or other problems with such a tool during the course of an automated operation. Due to the invention's ability to accurately and repeatedly detect a moving object even in the least conductive environments, it is ideal for industrial applications.

One preferred use of the non-contact laser based detection system is to detect the state of a drill bit on an automated drilling machine. Large fluctuating electronic signals are produced by projecting a laser beam near the tip of the drill bit and collecting the light reflected by the concave surfaces of the drill bit flute with a photodetector. By obtaining a thresholded signal and an amplified, thresholded signal, the state of a drill bit can be determined as either clean, clogged or broken.

The present invention uses the non-contact laser measurement system to determine whether the flute length of a rotating drill bit is sufficiently long enough for a specific drilling application. The fluted section of a drill bit will generate a fluctuating reflected light signal in response to laser light incident on this portion of the drill bit. However, the drill bit will not generate a fluctuating reflected light signal when the laser light is incident upon the shank portion of the drill bit or the collet of the drilling machine.

In one aspect of the present invention, the flute length is verified as being long enough for a specific application. This aspect of the invention includes a means for moving the drill bit relative to the laser light source. By inducing relative motion between the drill bit and the laser light source such that the laser light is first incident at or near the tip of the laser and is then incident a pre-selected distance from the tip, the pre-selected distance being at least the depth of the intended drill hole, the flute length of the drill bit can be verified as sufficient for a specific application.

In another aspect of the present invention, the actual flute length of the drill bit selected by the drilling machine is measured. By inducing relative motion between the drill bit and the laser light source such that the laser light source is first incident at or near the tip of the laser, and then continuing the relative motion, so that the laser light is incident on the fluted section until the laser light is incident upon the shank section, and recording the point at which the laser light was incident upon the tip and the shank section, the length of the fluted section of the drill bit can be measured with the non-contact laser based measurement system.

BRIEF DESCRIPTION OF THE DRAWINGS

FIG. 8 is a waveform diagram of four signals generated by the sensor electronics of FIGS. 6 and 7 when the drill bit is not broken and the flutes are clean;

FIG. 9 is a waveform diagram of four signals generated by the sensor electronics of FIGS. 6 and 7 when the drill bit is not broken and the flutes are clogged;

FIG. 10 is a waveform diagram of four signals generated by the sensor electronics of FIGS. 6 and 7 when the drill bit is broken;

DESCRIPTION OF THE PREFERRED EMBODIMENT

Reference is now made to the drawings wherein like numerals refer to like parts throughout. In general, FIGS. 1-6 refer to a prior art laser detection system which will hereinafter be described so as to facilitate an understanding of the present invention.

Figures 1, 1A:
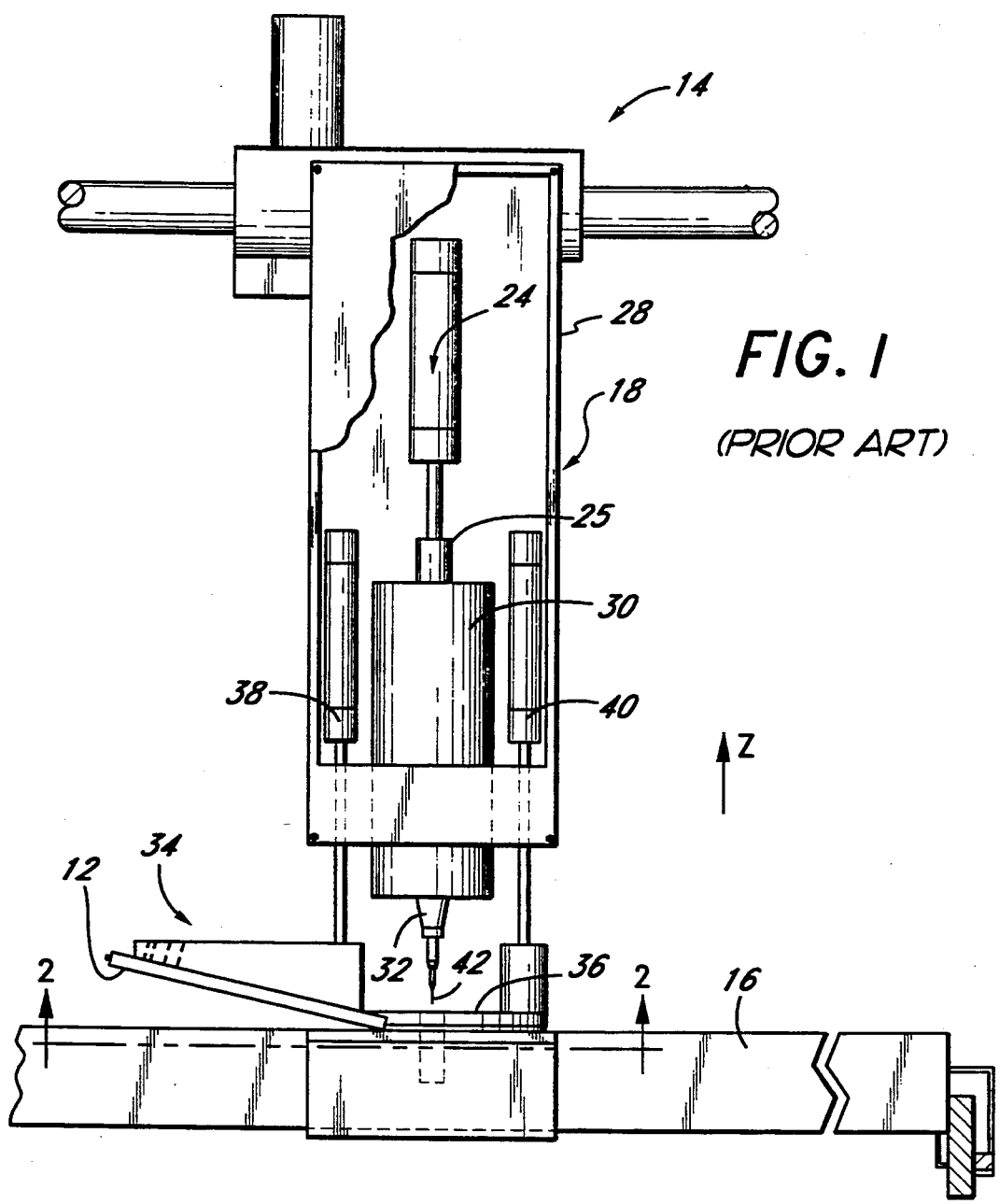
FIG. 1 is a fragmentary, front elevational view of an automated circuit board drilling machine having a laser detection system mounted thereon.
FIG. 1a is an enlarged, fragmentary view of a printed circuit board mounted on an automated circuit board drilling machine with a hole drilled into the board.
Figure 7:
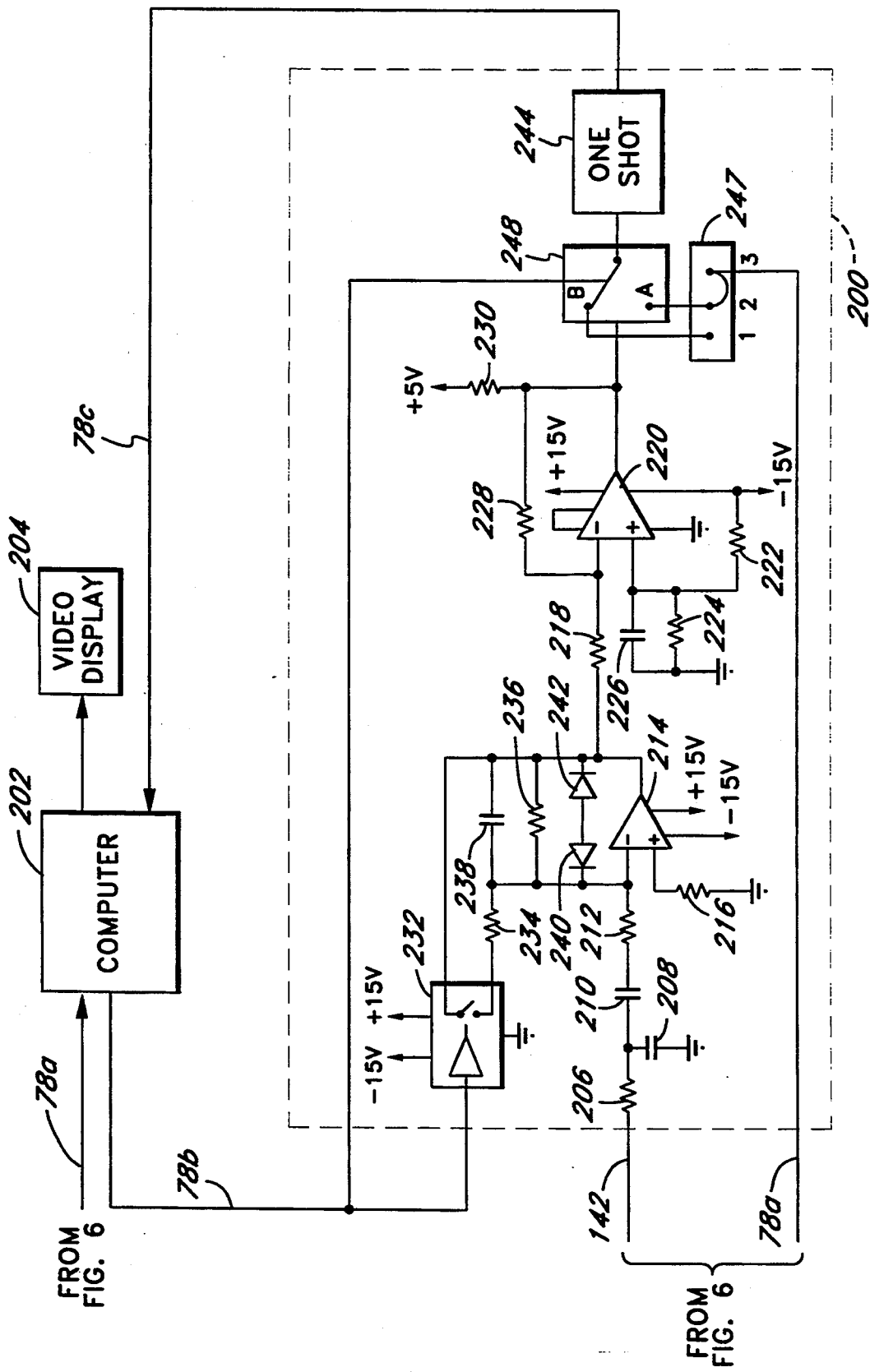
FIG. 7 is a schematic of the sensor electronics for amplified signal detection.

FIG. 1 shows a drilling machine, generally indicated at 14, for drilling holes in circuit boards. The automated drilling of holes in circuit boards is typically accomplished by mounting a circuit board 44 (FIG. 1a) to a servo motor driven worktable 16 of an automated circuit board drilling machine 14 which is controlled by a computer 202 (FIG. 7). Examples of such machines are the CONCEPT IV drilling and routing systems manufactured by Excellon Automation of Torrance, Calif. Although not shown, some automated circuit board drilling systems incorporate multiple drill or spindle assemblies arranged over a common servo motor driven worktable and controlled by a shared computer system (not shown) thereby permitting multiple circuit boards to be drilled by the system at any one time.

During the operation of the automated circuit board drilling machine 14 shown in FIG. 1, the circuit board 44 is accurately positioned on a worktable 16 below a spindle assembly 18 which rotates a drill bit 42 at speeds varying from approximately 15,000 to 100,000 rpm. To eliminate any problems caused by warpage of the circuit board 44 during the drilling process, a pressure foot 34 applies a force of about sixty pounds on the circuit board 44 to ensure that good contact is maintained between the circuit board 44 and the worktable 16. The pressure foot 34 also contains a vacuum system (not shown) to remove dust and debris generated by the action of the drill 42. The spindle assembly 18 and the pressure foot 34 are lowered and the rotating drill bit 42 forms a hole 52 in the circuit board 44. The entire drilling process is usually coordinated by the computer 202 (FIG. 7) and runs at speeds of about five holes per second.

The computer 202 controls such things as positioning of the worktable 16 feed rates of the board 44, rotational speed of the drill bit 42 (e.g. rpm), automatic changes of the drill bit 42, diameter verification of the drill bit 42 and flute length verification of the drill bit 42. The need for small pads, thin conductor lines, and narrow line spacings in printed circuit boards requires automated circuit board drilling machines to have the ability to drill numerous small to large high quality holes of varying diameters ranging from 0.004 to 0.250 inches. Following the lowering of the drill bit 42 to create a circuit board hole 52 (FIG. 1a), the drill bit 42 and pressure foot 34 are retracted and the circuit board 44 is automatically repositioned so that the next hole may be drilled.

Because the automated drilling machine 14 rapidly drills the necessary holes, at a rate of five per second, it is not possible for a person to visually inspect the tip of the drill bit 42 to see if it has been broken or damaged and attempt to stop the machine 14. Therefore, automated or non-contact methods were initially developed, using microwave and light occlusion techniques, to automatically check and react to broken and damaged drill bits.

Non-contacting light detection systems traditionally operate on the premise of projected light being occluded by the object desired to be detected and not by light reflection from the object. For a light occlusion system, the smaller the laser beam is with respect to the drill, the larger the fractional change in detected signal becomes. The problem with the light occlusion system (or LED system) is that the focused beam diameter is much larger than the smallest diameter drill. For the smaller diameters a very small fractional change in detected light must be sensed accurately. In a light occlusion system, any foreign objects in the path of the light will also block of occlude the beam and possibly give a false reading that the object is present. Occlusion systems are also based on a steady light signal. Steady state light detectors have been plagued by problems from dust, debris and other environment conditions. A system which detects fluctuating light, such as the reflected light system described in connection with the present invention eliminates nearly all interference from dust, debris and ambient light.

Figure 3A:
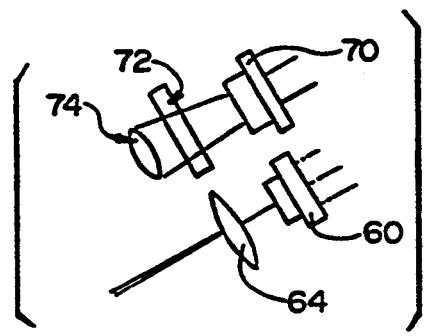
FIG. 3a is a top schematic view of the optical components of the laser detection system taken along the line 3—3 in FIG. 3.
Figure 3:
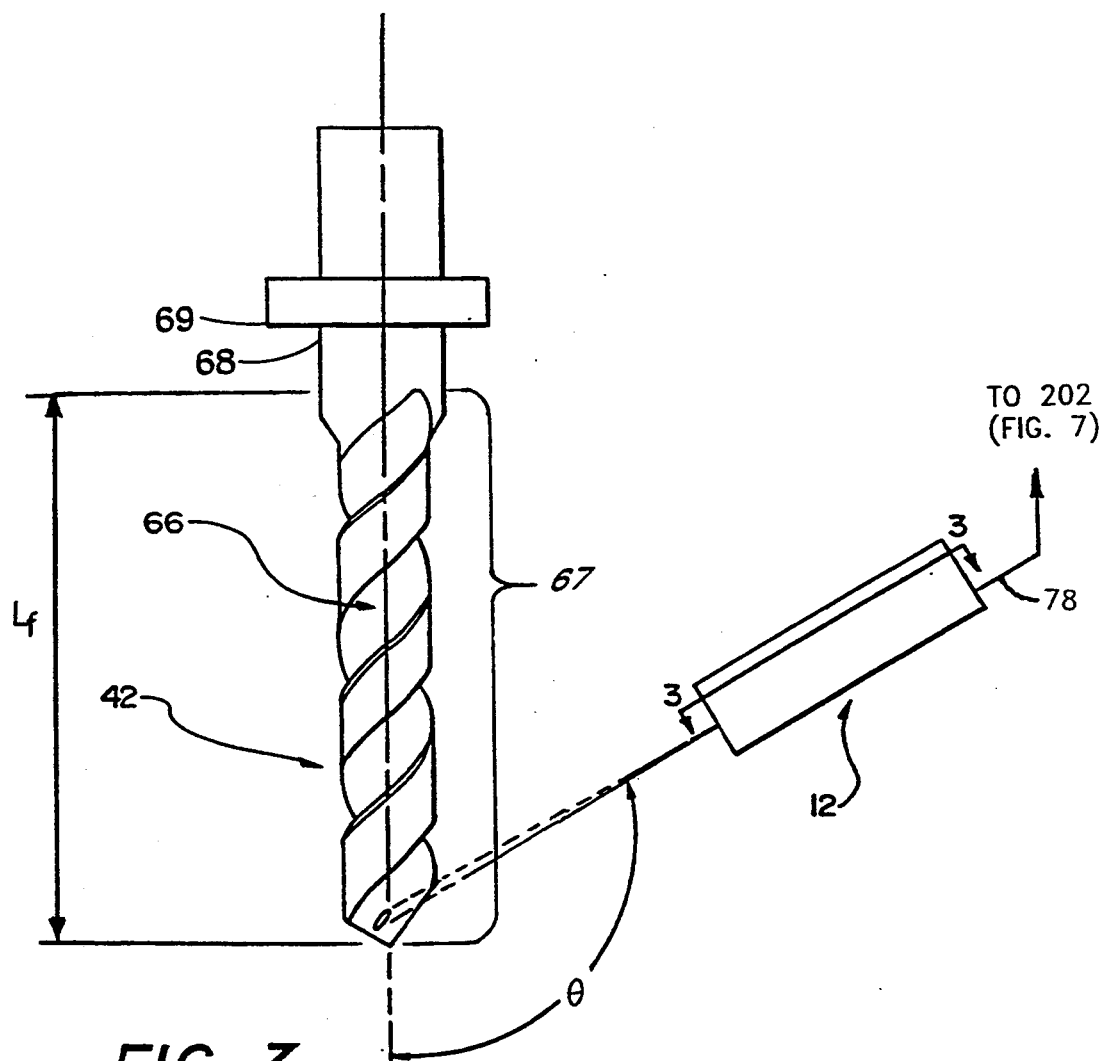
FIG. 3 is a schematic diagram depicting a drill bit and the laser detection system.

As shown in FIGS. 1 and 3 and other drawings, the present invention uses a laser detection sensor 12 to monitor the state of the drill bit 42. Of course, other rotating objects, such as router bits, may also benefit from the present invention. The use of a laser instead of a traditional incoherent light source greatly increases the sensitivity and accuracy of the detection system. Traditional light detection systems have smaller fractional signal changes from the object-present state to the object-not-present state than the present invention. Utilizing an LED light source detector on drill bit 42 diameters ranging from 0.004 to 0.250 inches, the light will be only partially occluded by the finer drill bits 42. Therefore, use of this method requires differentiation between small fractional signal changes from the object-present state to the object-not-present not-present state. A laser 60 is able to produce a more intense concentration of energy in the region of the drill tip than either standard LED or a microwave device. Use of a laser beam focused on a particular point of the moving object such as the tip of the drill bit 42, which reflects a signal back to the detector,if the drill bit tip is present, but does not if the drill bit is gone, greatly assists in producing a large ratio of signal change from the object-present to the object-not-present state.

Referring more specifically to the embodiment of a laser detection system shown in FIG. 1, a sensor, or laser detection system 12 for the non-contact laser detection of a drill bit 42 is depicted in conjunction with an automated circuit board drilling machine 14. The drilling machine 14 includes the worktable 16 which can accommodate a plurality of circuit boards 44 (FIG. 1a) to be drilled, and at least one drill or spindle assembly 18. A control module (not shown) includes the electronic circuitry for precise three dimensional position of the drill bit 42 in relation to the worktable 16, and error control circuitry (not shown) halts the drilling process when an error is detected by the sensor. The drill assembly 18 includes a drill case 28, a drill vertical positioning motor and lead screw assembly 24, a coupling 25, a spindle 30, a collet 32, the drill bit 42, and the pressure foot 34. The pressure foot 34 includes the pressure plate 36 and two pressure bearing piston and cylinder assemblies 38, 40. The detachable drill bit 42 is carried by the drill collet 32. The drill vertical positioning motor and lead screw assembly 24 causes the rotating drill bit 42 to bore a hole into the circuit board 44 as well as retract the drill bit 42 after a hole has been drilled.

The coupling 25 is an electrically controlled air driven solenoid value which either selects or de-selects the spindle assembly 30 in response to commands from the computer 202 (FIG. 7). In this preferred embodiment, the laser detection system 12 of the present invention will be used in conjunction with automated circuit board drilling systems, such as the Concept 4 MVII drilling machine manufactured by Excellon Automation, that Can select one or more of a plurality of spindle assemblies 18 and drill bits 42 to drill the circuit board 44 (FIG. 1a).

When a specific spindle assembly 18 and drill bit 42 has been selected in these drilling machines, the coupling 25 will vertically position the spindle assembly 18 such that the drill bit 42 is immediately adjacent to the upper surface of the circuit board 44 prior to drilling. Conversely, when a specific spindle assembly 18 is not intended to be used to drill holes in circuit boards during the current automated drilling sequence, and has been consequently de-selected, the coupling 25 will position the spindle 30 such that the drill bit 42 will be vertically raised away from the upper surface of the circuit board 44. For example, in Excellon Automation's Concept 4 MVII drilling machine, de-selecting a spindle will raise the drill bit 42 approximately 1.5" above the position of the circuit board 44 when the drill bit 42 has been selected.

The drilling sequence starts by loading a drill bit of a selected diameter in the drill collet 32. The drilling machine 14 then proceeds to drill a number of holes in the circuit board 44 (FIG. 1a) at various locations on the board. Upon completion of this operation, another drill bit of possibly different diameter is loaded in the collet 32 and the process is repeated until all holes are drilled in the circuit board 44. Problems arise when the drill bit 42 either breaks or is missing during the drilling operation, or if the drill bit 42 does not have flutes over a long enough section of the drill bit 42 to drill a hole of the intended depth.

Referring to FIG. 1a, the printed circuit board 44 is shown positioned between the upper surface of the worktable 16 and the pressure plate 36. The printed circuit board 44 includes an electrically nonconducting substrate 46 and a plurality of conducting lines 48 positioned within the substrate 46 in a plurality of conducting layers 48a, 48b, 48c, 48d. The drill bit 42 is depicted in FIG. 1 as being withdrawn from a drill bit passage aperture 50 of pressure plate 36 after drilling a hole at 52 to connect conducting layers 48a, 48b, 48c.

Figure 2:
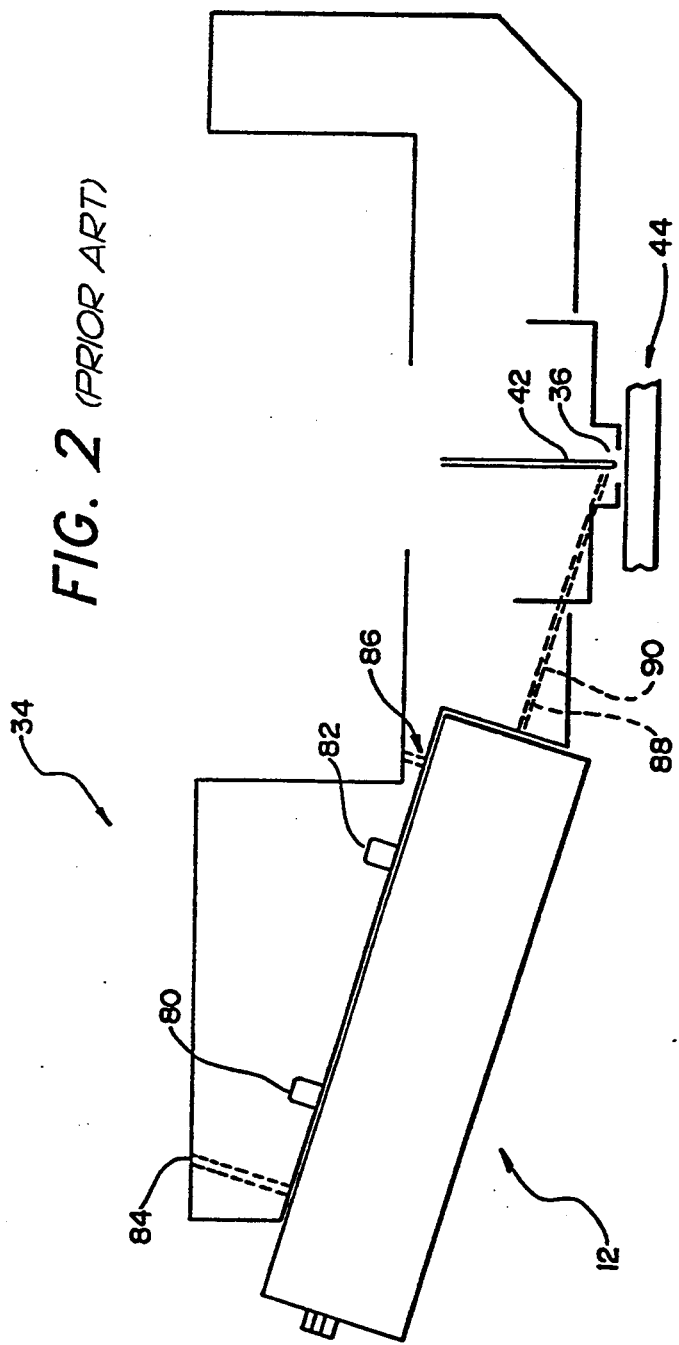
FIG. 2 is a cutaway side view of the pressure foot assembly taken along the line 2—2 in FIG. 1.

FIG. 2 shows the pressure foot assembly 34 in more detail including the laser detection system 12 and assumes that the spindle assembly has been selected for drilling. The laser detection system 12 is positioned such that a projected laser beam is in direct line of sight with the tip of the drill bit 42, while the spindle assembly 30, corresponding to the drill bit 42, after the drill bit 42 has completed drilling and has been minimally retracted into the pressure foot assembly 34. By mounting the sensor 12 inside the pressure foot 34 and projecting the laser beam near the tip of the drill bit 42, the presence of the drill tip may be verified after each drilling stroke.

As shown generally in FIGS. 2 and 3, the preferred detection system minimizes the distance required for the drill bit 42 to be retracted by projecting the laser beam down the axis of rotation forming an angle that is approximately 25 degrees above a normal to the axis, thus being positioned at an oblique angle to the axis of the drill 18. It is preferred that the angle be over 90 degree from the axis to about 120 degrees. Hence, increased drilling machine throughput is obtained by projecting the laser beam and sensing the reflected light at an angle oblique to the drill axis of revolution. When the drill assembly 18 retracts as shown in FIG. 1a, debris and copper shavings produced during drilling enter the cavity formed in the pressure foot 34. Projection at normal incidence, as was done with some past designs, complicates vacuum design since the optics would then be located in a direct ballistic path of the debris generated by the drill bit 42.

Now referring specifically to FIG. 2, which illustrates the mounting of the sensor 12 to the movable pressure foot 34, a pair of positioning dowels 80 and 82 located inside the pressure foot 34 provide alignment for the sensor. Support screws 84 and 86 which hold the detection device 12 in place are located at the top of the pressure foot assembly 34. Light pathways 88 and 90 are machined through pressure foot 34 to provide direct lines of sight to the drill bit 42 for a light source 60 and a photodetector 70 (FIG. 3a).

The laser diode, lenses, filters, and sensor head electronics are housed in a mechanical mount which serves as the sensor body 12. The sensor body may be an integral part of the drilling machine pressure foot 34 or a modular unit mounted in the pressure foot 34.

FIG. 3 is a schematic representation showing the drill bit 42 and the sensor 12 in more detail. The drill bit 42 shown in FIG. 3 is typical of drill bits used in circuit board drilling applications and it includes a tip and cutting surfaces 65, a fluted section 67 with a helical concave flute 66 running the length of the fluted section 67, and a shank section 68. The fluted section 67 of the drill bit 42 serves to remove debris from the face of the hole resulting from the drilling process. The flute length $L_f$ of the drill bit 42 is defined as the distance between the tip 65 of the drill bit 42 and the shank section 68 which contains the flutes 66. The shank section 68 normally has a diameter which is greater than the diameter of the fluted section 67. Typically, the diameter of the shank section 68 of a series of different cutting diameter drill bits used on one drilling machine 14 will be one standard diameter thereby facilitating automated drill bit switches by the collet 32 of the drilling machine 14 (FIG. 1). A collar 69 is positioned on the shank portion 68 so that when the drill bit 42 is inserted into the collet 32 such that the collar 69 is flush against the collet 32, the tip 65 of the drill bit 42 will extend a predetermined distance from the drilling machine 14 towards the drilling surface.

FIG. 3a illustrates the optical components of the sensor 12. As shown in FIGS. 3 and 3a, focusing optics take the output of a laser diode 60 and project light onto the drill bit 42. The light from the laser diode 60 is projected through stripe projecting optics 64 and onto the drill bit 42.

Utilizing a focused laser also allows the light source to be located further from the object giving greater immunity to environmental conditions and greater flexibility in machine design. The focused laser light reflects off the concave flute surfaces 66 of the drill bit 42. The utilization of the concave surface of the drill bit flutes 66 also assists in enabling the sensor 12 to be more conveniently located or moved. The ability to locate the sensor 12 away from the object in motion and away from a ballistic debris path makes the sensor 12 less susceptible to environmental interferences. The reflected light is then collected and collimated by a receiving lens 74, filtered by an optical filter 72, and collected by a solid state photodetector 70. The optical filter 72 blocks ambient visible illumination from reaching the photodetector 70 while allowing the near-infrared light from the laser diode 60 to be collected by the photodetector 70. A cable 78 to the computer 202 (FIG. 7) is also connected to the sensor 12 allowing various electrical signals to be sent and received by the sensor 12. One of the signals which travels on the cable 78 is the beam detect signal. The beam detect signal is generated each time a drill bit flute 66 is detected. The drill bit 42 is considered broken or absent when the beam detect signal does not change states for a period of time which comprises at least one complete drill revolution.

In order to accommodate a wide range of drill bit diameters, the sensor optics may project a stripe of light onto the drill bit 42. This will ensure that there will be at least one point per flute 66 on the drill bit 42 which will reflect light back to the photodetector 70. Optical alignment is also less critical when using a stripe of light. To generate a stripe of light, the focusing optics 64 may incorporate cylindrical or toric elements. Stripe projection dimensions of approximately 10.004 inches in height and 0.020 inches in width appear preferable. For a fixed output of the laser diode 60 the larger the stripe the lower the optical power density at the point of best reflection on the drill bit 42. The optical power density at a point in the stripe will be lower than it would be for a spot of light. This results in less received optical signal at the detector 70.

When light is projected at an angle normal to the drill axis, the laser beam is preferably focused at or about the drill axis. When the light is projected at an oblique angle with respect to the drill axis of revolution, which is a preferred embodiment, the photodetector 70 receives the largest signal when the light is reflected from a point on the concave drill bit flute surface 66 which is slightly off the drill axis. The best reflection point is a function of the laser beam projection angle, the drill bit helix angle, and the diameter of the drill bit 42. For a fixed drill bit helix angle and a fixed laser beam projection angle, the best reflection point is further away from the drill bit axis for large diameter drill bits than it is for smaller diameter drill bits.

A large fluctuating signal is thus produced as the drill bit 42 rotates. The laser beam is reflected from each of the two flute surfaces 66 of the rotating drill 42 to the detector 70, giving an oscillating, or AC, signal having a frequency which is directly related to the frequency of rotation of the drill bit. Thus, the presence of the oscillating signal of laser light, at the predetermined frequency, can be sensed. Other frequencies, including DC or ambient light, can be optically and electronically filtered as described below. The absence of such an AC signal, of course, means the tip of the drill bit 42 has been broken or damaged or that the laser 12 is no longer focused on the fluted section 67 of the drill bit 42 but instead is focused on another section of the drill bit 42.

Figure 4:
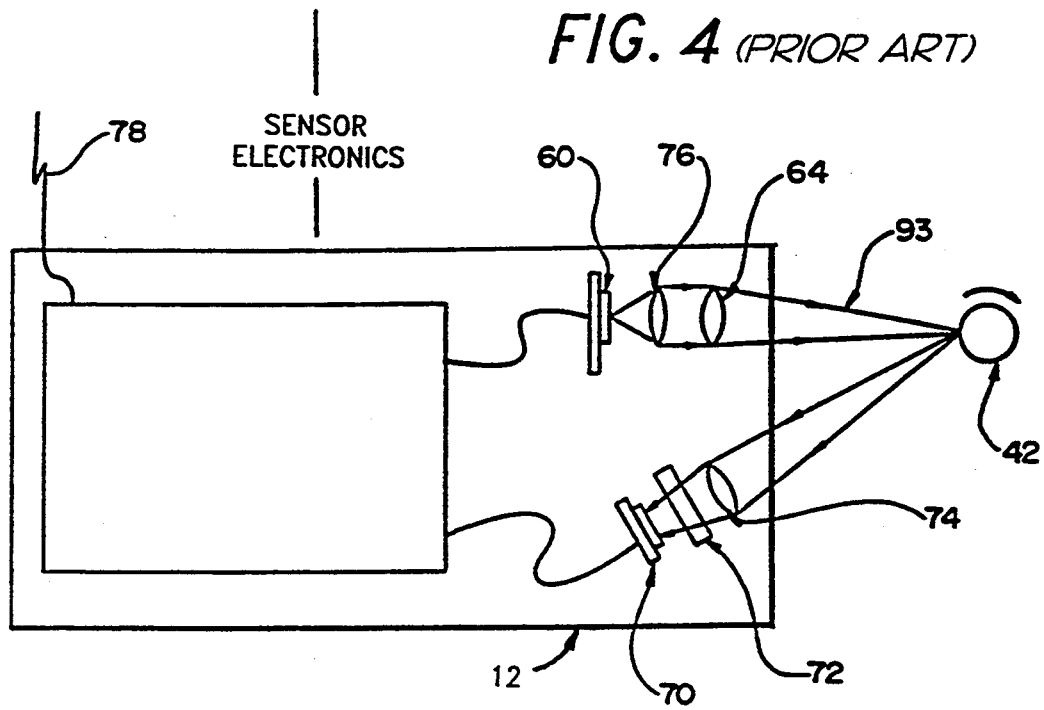
FIG. 4 is a top schematic view of the laser detection system including the sensor electronics.

The optical components and sensor head electronics are housed in a mechanical mount which serves as the sensor body 12 as shown in FIG. 4. FIG. 4 schematically shows the details of the sensor body 12 and its relation to the drill bit 42. The sensor body 12 houses the optics including the laser diode 60, source lens 76, stripe projecting optics 64, photodetector 70, optical filter 72, and receiver lens 74. The sensor body 12 also houses the electronics of FIGS. 5, 6 and 7, which will be described hereinbelow. The cable 78 is connected to the sensor 12 allowing various electrical signals to be sent and received from the computer 202 (FIG. 7).

As is shown in FIG. 4, the lenses are not projecting and receiving in parallel paths to each other but form an angle. This angle can range from 0 to 90 degrees when the lenses are in the same horizontal plane. The source lens 76 and stripe projecting optics 64 shown in FIG. 4 may be combined into a single toric shaped optical element.

Figure 5:
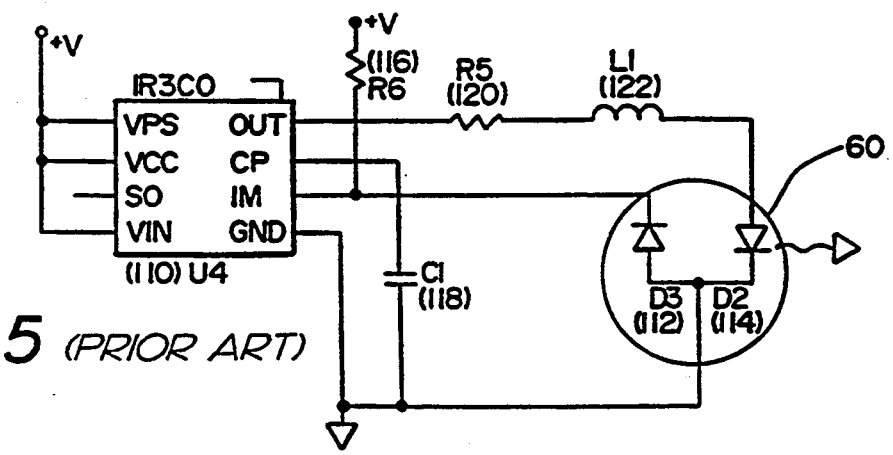
FIG. 5 is a schematic of the sensor electronics controlling the output of the laser diode.
Figure 6:
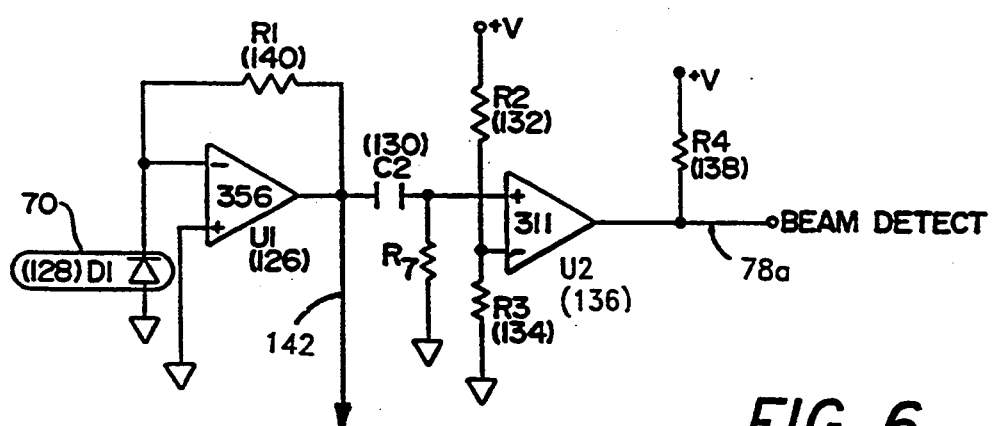
FIG. 6 is a schematic of the sensor electronics which amplify the output of the photodetector and produce a beam detect signal when the presence of a drill bit is sensed.

The sensor electronics shown in FIGS. 5 and 6 control the laser power, amplify the output of the photodetector 70, and produce the beam detect signal when the presence of a drill bit 42 is sensed.

The integrated circuit 110 in FIG. 5 controls the output power of the laser diode 60. The output of a photodiode 112, which is packaged with a laser diode 114, is used as feedback to the integrated circuit 110 to maintain constant optical power. A programming resistor 116 adjusts the output power of the laser diode 114.

FIG. 6 shows the electronics which convert the light falling on the photodetector 70 to a signal that the drill bit 42 was sensed. A transimpedance amplifier 126 is used to generate a voltage proportional to the amount of light falling on a photodetector diode 128. A blocking capacitor 130 allows only fluctuating voltage signals to be applied to the input of a comparator 136. When the level of this fluctuating voltage exceeds the threshold voltage level established by the voltage divider network of a pair of resistors 132 and 134, the output of the comparator 136, indicates that a drill bit was sensed. The output of the comparator 136 is sent to the computer 202 (FIG. 7) along a line 78a so that if the output of the comparator 136 indicates that the drill bit 42 has not been detected, corrective action may be taken.

In a more elaborate implementation, the signal can be sampled and the samples processed in a detector that is coherent to the frequency of rotation. If the drill bit 42 has a frequency of rotation that is known, for example from an electrical feedback mechanism (such as a tachometer) attached to the spindle assembly 18, an adjustable electronic filter can be implemented such that the detector looks for signals only around a narrow band of frequencies centered at the drill bit's 42 frequency of rotation. This has the effect of reducing the electrical noise bandwidth and hence increasing the electrical signal-to-noise ratio.

Since the laser source 60 can concentrate a large amount of energy on a small area of the drill tip, large fractional signal changes occur at the detector 70 when a drill tip breaks. Also, because the output of the detector 70 is electronically filtered such that only fluctuating (AC) signals are considered, the sensor 12 becomes immune to changes in the background light level.

Note that, in the present invention, an analog beam signal is provided from the beam detection circuit of FIG. 6 by the amplifier 126, and the signal is fed to a line 142 where it is processed by the circuit of FIG. 7.

FIG. 7 is a schematic of a flute detection circuit 200 of the present invention. The detection circuit 200 is provided with a switch select signal from the computer 202 via a line 78b and an analog beam signal from the beam detect circuit of FIG. 6 via the line 142. The detection circuit 200 generates a flute state signal to the computer 202 across a line 78c. The computer 202 processes the beam detect signal (fed across the line 78a) and the flute detect signal to arrive at an extended state of the drill bit 42 (FIG. 1) which is displayed on a video display 204.

As discussed hereinabove, the prior art laser detection system determines the state of an object in continuous motion as to one of the following: presence or absence. In a drilling machine embodiment, these states correspond to drill bit normal and drill bit broken. However, if a drill bit becomes clogged with foreign material, the prior art system may provide a false detected state that the drill bit is broken.

The false detection of a broken bit is principally due to the fact that when the flutes of the bit are clogged with circuit board material, such as epoxy resin, the reflective characteristic of the drill bit flutes is lowered to the point that the beam detection circuitry does not generate a significant signal change to identify the flutes. That is, the voltage of the detected signal does not exceed the predetermined threshold value. In many instances, the misidentification of a broken drill bit leads to a loss of drilling machine utilization while the machine is halted to check and clean the drill bit. Therefore, a major objective of the invention described in U.S. Ser. No. 07/791,416, in a drilling machine embodiment, was to provide an extended drill bit state selected from the following set: (1) drill bit normal, (2) drill bit broken and (3) drill bit clogged.

Further, since the prior art system only focuses a light beam on one portion of the drill bit, typically the tip, the prior art system is incapable of detecting whether the drill bit has a sufficiently long fluted section to drill the intended holes. Use of a drill bit with a flute length which is less than the depth of a hole can result in damage to the circuit board. An insufficient flute length can occur from either an incorrect selection of a drill bit or from damaged flutes caused, for example, the bit having been sharpened and resharpened over an extended period.

Circuit board damage stems from the larger diameter shank section 68 (FIG. 3) coming into contact with the upper surface of the circuit board as the drilling machine attempts to drill the hole. The shank section is then likely to bore a hole in the circuit board which is too large. Such an error could cause the board to be damaged to the point of uselessness. Additionally, drilling bits 42 will also often be broken when the shank section of the drill bit makes contact with the upper surface of the circuit board. Hence, a principal objective of the present invention, in the drilling machine embodiment, is to provide an additional drill bit state of the selected drill bit as an insufficient flute length. The presently preferred embodiment of the present invention which achieves this objective includes the circuit illustrated in FIG. 7 and additional computer software executed by the computer 202 which is discussed in some detail with reference to FIGS. 11 and 12 below.

Now referring back to FIG. 7, the analog beam signal received by the circuit 200 via the line 142 is amplified, in the presently preferred embodiment, by an analog buffer amplifier (not shown) to compensate for the attenuation of the signal between the circuits of FIGS. 6 and 7 which are preferably located on different printed circuit boards. The beam signal is low pass filtered across a resistor-capacitor or RC filter 206, 208, i.e., the high frequency components of the signal are removed. The beam signal is then fed to an AC coupling capacitor 210. The AC coupling capacitor 210 blocks the DC component of the signal and passes the AC components.

The beam signal is then fed from the capacitor 210 to the inverting (−) input of an operational amplifier 214 through a resistor 212. A resistor 236 is the feedback element of the amplifier circuit. The ratio of the two resistors 212, 236 will determine the gain of the amplifier 214. A resistor 216, connected between ground and the non-inverting (+) input of the amplifier 214, minimizes bias and offset current effect. The amplifier 214 is preferably chosen so as to amplify the low frequency components of the beam signal by a factor of at least 100. The amplified beam signal is then fed through a resistor 218 to the positive input of a comparator 220, which is a part of a thresholding circuit.

The thresholding circuit includes the comparator 220, which provides a digital signal output. The comparator 220 is fed a negative threshold voltage by the voltage divider network comprising a resistor 222 (directly connected to negative power), and a resistor 224 (directly connected to ground). A capacitor 226 is connected in parallel with the resistor 224 to provide low pass filtering of the threshold signal. The thresholding circuit also includes a second resistor 228 which is located across the positive voltage input and the output of the comparator 220. The resistors 228, 218 serve to mitigate a characteristic hysteresis in the comparator 220 when the amplified beam signal has a voltage that is close to the threshold value. A threshold voltage of −0.67 V is presently preferred, although one skilled in the technology will understand that the threshold will vary according to the parameters of the particular circuit 220 embodying the invention. The thresholding circuit also includes a pull-up resistor 230 that is coupled between a positive power input and the output of the comparator 220.

During normal operation the digital beam signal provided on the line 78a is connected via a jumper 247 from pin 3 to pin 2, which is connected to input A of a multiplexer 248. Input B of the multiplexer 248 is connected to the output of the comparator 220 carrying the flute detect signal. The computer 202 will connect via line 78b first the beam detect signal and then the flute detect signal to the input of a one shot 244 and monitor the output of the one shot 244 across a line 78c at the appropriate time.

Instead of using the fixed thresholded beam detect signal via the line 78a, jumpering 247 pins 2 to 1 will allow the circuit to generate an adjustable threshold for an equivalent beam detect signal. If the computer 202 selects output A of the multiplexer 248, an analog switch 232 closes, connecting a feedback resistor 234 in parallel with the high gain feedback resistor 236. The gain of this amplifier 214 is now determined by the ratio of the parallel resistance of the resistor 234 and the resistor 236, and the input resistor 212. Adjusting the gain of the amplifier 214 would be equivalent to changing the threshold of the comparator 220. A capacitor 238 functions as a low pass filter. A pair of zener diodes 240, 242 provide a voltage clamp to limit the voltage of the circuit 200. This method of operation may be desirable to detect clogged drills of larger size, for example, a 0.030 inch bit, which tend to produce an analog beam detect signal 142 of larger amplitude even for clogged drills.

This implementation use is two thresholds to differentiate between clean, clogged, and broken drills. It should be apparent that there are many ways the difference between signals 250 (FIG. 8) and 250' (FIG. 9) can be detected. For instance, one such way would be to detect the peak of signal 250 and 250', feed it through an analog to digital converter to the computer 202 and to let a software algorithm analyze the condition of the drill.

Now, returning in the discussion to the comparator 220, the resulting output is a digital or pulsed signal having high and low voltage levels. This digital signal is indicative of a second order "signature" of the drill bit 42 that generates periodic pulses at frequencies determined according to whether the drill bit flutes are clean or clogged. The pulses can be detected by a one shot integrated circuit 244 which is presently preferred to be a 74LS123 device available from Texas Instruments, for example. If the pulse frequency is greater than or equal to a preselected value, for instance, once every 6 milliseconds, then a continuous high voltage is generated by the one shot 244, indicating that the drill bit is not broken. Otherwise, if the pulse frequency is less than the preselected frequency, a continuous low voltage is generated by the one shot 244. This flute detect signal, provided by the one shot 244, is fed from the circuit 200 across the line 78c to the computer 202 for data processing.

The computer 202 receives the digital signals corresponding to beam detect and flute detect across the lines 78a and 78c, respectively. Note that the beam detect signal is produced by the prior art circuit of FIG. 6, and the flute detect signal is produced by the flute detection circuit 200 of the present invention. It is only through the combining of both of these signals that a clogged bit state can be determined.

The following logic table summarizes the signal combinations processed by the computer 202 in obtaining the extended state of the drill bit 42:

| Beam Detect Signal | Flute Detect Signal | Extended Bit State |
| --- | --- | --- |
| 1 | 1 | Drill bit clean |
| 0 | 1 | Drill bit clogged |
| 0 | 0 | Drill bit broken |

Note that the combination of a logical high, or "1", value for the beam detect signal and a logical low, or "0", value for the flute detect signal is undefined and, if it is detected by the computer, will result in an error condition. This bit state detection could of course be handled by a simple circuit constructed from logic gates. However, the state detection is preferably accomplished in the computer 202 which is a part of the prior art drilling machine 14 (FIG. 1). For instance, the CNC-6 model, having a Zilog Z8000 microprocessor, or the CNC-7, having a Motorola M680x0 microprocessor, are presently available with the drilling machines manufactured by the assignee of the present invention, Excellon Automation.

The computer 202 preferably sends a warning message to the video display 204 when the drill bit is clogged. In this way, the drilling machine operator (not shown) can take appropriate action if the bit is clogged. Such an operator dependent decision allows the drilling to continue, under certain circumstances, and thus prevent "nuisance stops" of the drilling machine. For example, if green circuit boards are being drilled, the operator may choose to let a certain number of boards be drilled with the clogged bit before the machine is stopped to clean the bit. On the other hand, if the drill bit is broken, the drilling machine is almost always stopped immediately, whether automatically by an initialization parameter or by operator intervention.

Referring generally to, FIGS. 8, 9 and 10, the function of the present invention is more fully understood by reference to example waveform diagrams showing certain signals of the laser detection circuit of FIGS. 6 and 7 during a test. The illustrated examples show an analog beam signal waveform 250, an AC amplifier signal waveform 252, a beam detect signal waveform 254 and a flute detect signal waveform 256. With reference back to FIG. 7, the irrelevant signals are obtained as follows: the analog beam signal is provided on the line 142; the AC amplifier signal is provided at the output pin of the amplifier 214; the beam detect signal is provided on the line 78a; and the flute detect signal is provided on the line 78c. The waveforms were captured at the following oscilloscope resolutions: waveform 250–200 millivolts/-division, waveform 252–5 volts/division, waveform 254–5 volts/division and waveform 256–5 volts/division. A drill bit having a 0.006 inch diameter was used during the test.

With specific reference to FIG. 8, the waveforms shown are representative of a "drill bit clean" state. It will be observed that the analog beam waveform 250 is indicative of a periodic reflected light signal, and the periodicity of the signal is related to the spinning drill bit wherein each flute of the bit causes a voltage spike. The waveform 250 is smoothed, filtered and amplified by the circuit 200, resulting in the waveform 252 which is now ready for digitization. The digital beam detect waveform 254 exhibits a pulsed signal having low voltage levels when the threshold of the beam detect circuit (FIG. 6) is not exceeded, indicating a non-flute surface of the drill bit 42. The digital flute detect waveform 256 exhibits a pulsed signal having a relatively higher threshold than the beam detect signal, but which causes pulses of the same frequency as the waveform 254.

Turning to FIG. 9, the illustrated waveforms are representative of a "drill bit clogged" state. In this state, the analog beam waveform 250', although periodic, does not exhibit the voltage spikes that are characteristic of a clean drill bit. As a result, the digital beam detect waveform 254' is a continuous low voltage which, without the benefits of the present invention, would falsely indicate that the drill bit is broken, thereby causing the drilling machine to be halted. However, the amplified signature, i.e., the AC amplifier signal, indicated in FIG. 9 by the waveform 252' exhibits second order effects of the drill bit flutes. The amplified signal provides a periodic waveform having great enough amplitude variation that it may now be thresholded for later analysis. This thresholded signal is illustrated in FIG. 9 by the flute detect waveform 256'. Note that, in this example, the one shot 244 (FIG. 7) would provide a continuous high voltage signal to the computer 202. Thus, in the example of FIG. 9, the drill bit is determined to be present, but unclean or fouled, by the computer 202.

Lastly, in FIG. 10, the illustrated waveforms are representative of a "drill bit broken" state. In this state, all of the waveforms 250", 252", 254", 256" indicate continuous low voltage signals, which correspond to the absence of a drill bit.

The foregoing discussion describes one preferred embodiment of a laser based system to check for broken or clogged drill bits on automated drilling machines. The present invention uses the above-described laser based system, in conjunction with an automated drilling machine, to ensure that the flute lengths of the selected drill bits are sufficiently long for the intended drilling application.

Figure 11:
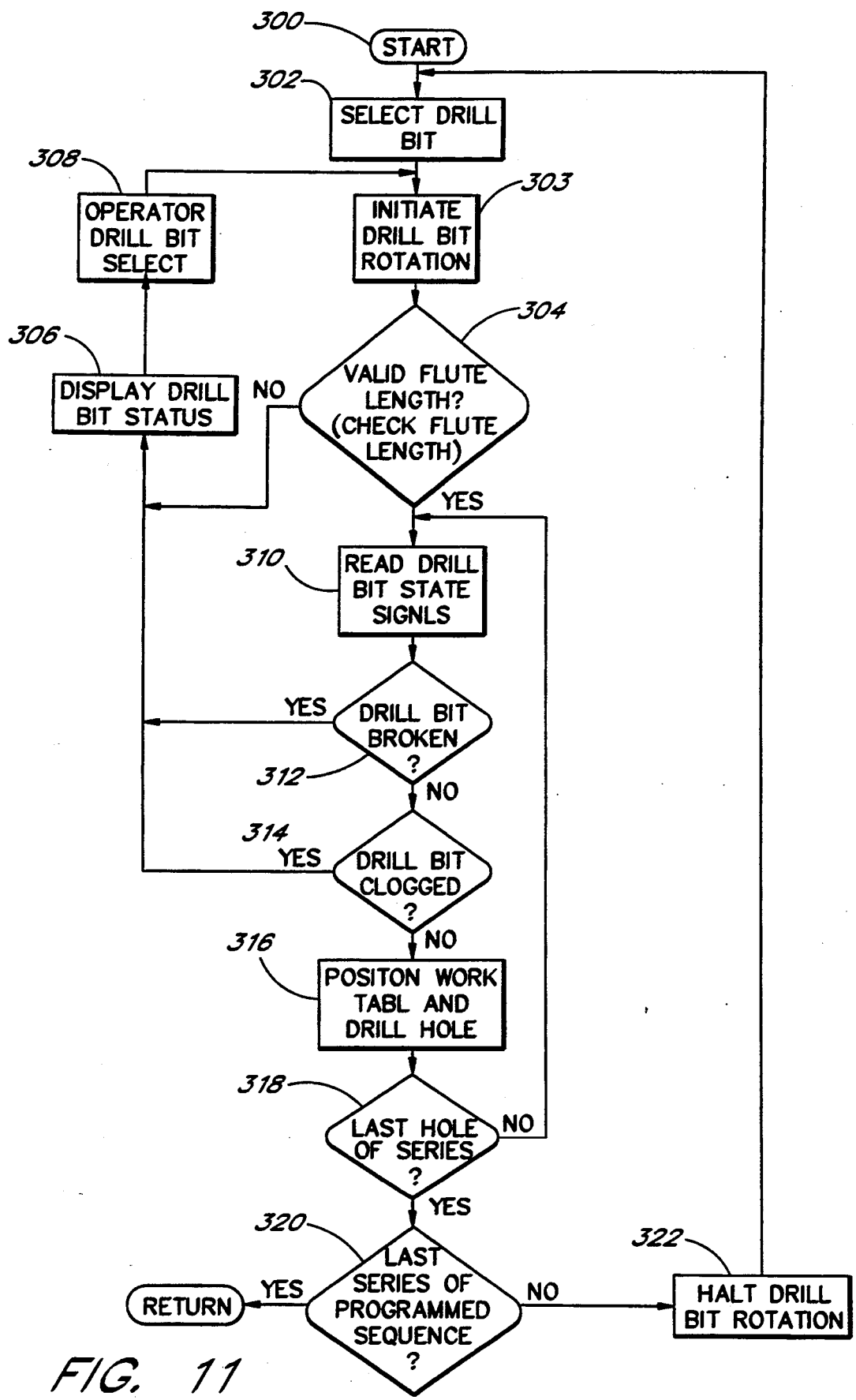
FIG. 11 is a flow diagram of the operation of an automated drilling machine equipped with the laser detection system of the present invention during an automated drilling sequence or cycle.

FIG. 11 illustrates an operational flow followed by the presently preferred automated circuit board drilling machine 14 (FIG. 1), when the drilling machine 14 is performing a programmed or automated drilling sequence. Automated drilling machines of this type are typically programmed by the machine operator, via the computer 202 (FIG. 7) to perform a specific drilling sequence. The operator programs a specific automated drilling sequence by programming the automated drilling machine to drill holes of a particular diameter and depth at specific locations on the circuit board 44.

The automated drilling machine 14 interprets the instructions provided by the operator, and selects drill bits with an appropriate diameter and length to drill these holes. After selecting the appropriate drill bit 42, the drilling machine 14 uses the worktable 16 (FIG. 1) to correctly position the drill bit 42 over the circuit board 44, in the X and Y directions, and then uses the vertical positioning motor and lead screw assembly 24 to drill the hole with the drill bit 42 to the appropriate depth and diameter specified by the operator.

Referring more specifically to FIG. 11, the basic operation of an automated drilling machine 14 equipped with a preferred embodiment of the laser based system, of the present invention, as it performs a typical programmed drilling cycle or sequence will now be described. After the operator has programmed the drilling cycle, the automated drilling machine 14 (FIG. 1) moves from a start state 300 to state 302 where the drilling machine 14 selects the appropriate drill bit 42 (FIG. 1) for the first series of holes to be drilled. In automated drilling machines, the drill bits 42 are usually stored at a place which is accessible to the automated drilling machine 14 and they are ordered according to drill bit diameter and length. Hence, the automated drilling machine 14, in response to signals generated by the computer 202 (FIG. 7), selects a drill bit having an appropriate diameter and length for the specified hole(s).

Generally, each series of holes to be drilled are those holes, located at various locations on the circuit board, which will have the same diameter and a similar depth.

For example, a series of holes may be drilled of 0.025" diameter and a range of depths from 0.125" to 0.250". Consequently, the drill bit 42 (FIG. 3) selected for a particular series of holes is the drill bit 42 having the same diameter as the holes to be drilled in the series, and with a flute length $L'_f$ sufficient to drill the deepest hole in the series without having the shank section 68 come in contact with the upper surface of the circuit board 44 (FIG. 2a). In the example, the drill bit 42 would require a flute length $L''_f$ of at least 0.250". Consequently a typical programmed drilling sequence will be made up of a multiple series of holes to be sequentially drilled.

After selecting a drill bit in state 302, the drilling machine 14 moves to state 303 to activate the spindle motor (not shown) in the spindle assembly 30 (FIG. 1) which causes the drill bit 42 to rotate at its operational speed. Next, the drilling machine 14 moves to a decision state 304 where the drilling machine determines whether the drill bit 42, selected in state 302, has an actual flute length $L'_f$ greater than or equal to the minimum desired flute length $L'_f$. The selected drill bit 42 may not actually have the minimum desired flute length due to, for example, excessive sharpening of the cutting surface of the drill bit. In the presently preferred embodiment, the drilling machine 14 makes this determination by executing the "CheckFluteLength" function on the computer 202, which will be described in greater detail in reference to FIG. 12 below.

If the drilling machine 14 determines, in decision state 304, that the actual measured flute length $L_f$ of the drill bit 42 selected in state 302 does not have the minimum length to drill the programmed holes, the drilling machine 14 proceeds to state 306 where it displays on the video display 204 (FIG. 7) an indication that the flute length $L_f$ of this drill bit 42 is too short for the series of holes it is programmed to drill. From state 306, the drilling machine 14 proceeds to state 308 where the operator preferably replaces the existing drill bit 42 with a drill bit having a flute length $L_f \geq L'_f$. The drilling machine 14 proceeds from state 308 back to state 303 where the drilling machine 14 again causes the drill bit 42 to rotate at its operational speed as previously described.

If the drilling machine 14 determines, in decision state 304, that the flute length $L_f$ of the drill bit 42 selected in state 302, or provided by the operator in state 308, is satisfactory, the computer 202 of the drilling machine 14 proceeds to read the drill bit state signals in state 310. In the presently preferred embodiment, the drill bit state signals include the beam detect signal, provided by the sensor electronics of FIG. 6 across the line 78a, and the flute detect signal, provided by the circuit 200 of FIG. 7 across the line 78b. These signals provide an indication as to whether the drill bit 42 selected in state 302 is either clean, clogged or broken as described previously in relation to FIGS. 6 and 7.

From state 310, the drilling machine 14 then proceeds to a decision state 312 where the computer 202 (FIG. 7) evaluates the state signals read in state 310 to determine whether the drill bit 42 selected in state 302 is broken. If the computer 202 determines that the drill bit 42 is broken, the drilling machine 14 proceeds to state 306 where a message, indicating the drill bit is broken, is displayed on the video display 204 (FIG. 7). The drilling machine 14 then moves from state 306 to state 308 where the operator typically replaces the broken drill bit 42. After replacing the broken drill bit 42, the drilling machine 14 returns to state 303 where the replacement drill bit 42 is rotated at its operational speed as previously discussed.

If, in decision state 312, it is determined that the drill bit 42 is not broken, the drilling machine 14 proceeds to a decision state 314 where the computer 202 (FIG. 7) evaluates the state signals read in state 310 to determine whether the flutes 66 (FIG. 3) of the drill bit 42 are clogged. If the computer 202 determines that the flutes 66 of the drill bit 42 are clogged, the drilling machine 14 moves from decision state 314 to state 306 where a message, indicating that the flutes 67 of the drill bit 42 are clogged, is displayed on the video display 204 (FIG. 7). From state 306, the drilling machine 14 proceeds to state 308 where the operator can either clean the flutes 66 of the drill bit 42, replace the drill bit 42 with a clean drill bit or cause the drilling machine 14 to continue the drilling cycle with the clogged drill bit 42. In the case where the drill bit is replaced, the drilling machine 14 proceeds to state 303 where the replacement drill bit 42 is rotated at its operational speed as previously discussed.

In the case where the drill bit 42 is cleaned, the drilling machine 14 follows a control flow, which is not shown in FIG. 11, where the drilling machine 14 first enters a state where the rotation of the drill bit is halted, at which time the operator cleans the drill bit. The drilling machine 14 then proceeds to a state where the drill bit 42 is again rotated at its operational speed, after which, the drill bit proceeds to state 316 where the drilling machine 14 positions the worktable 16 and drills a hole. Further, in the case where the operator signals, in state 308, to the drilling machine 14 to continue drilling in spite of the clogged flutes, the drilling machine 14 follows a control flow, also not shown in FIG. 11, where the drilling machine 14 proceeds directly from state 308 to state 316 where the drilling machine 14 positions the worktable 16 and drills a hole.

If the computer 202 (FIG. 7) determines, in decision state 314, that the drill bit 42 is not clogged, the drilling machine proceeds to state 316 where the worktable 16 is positioned so that the drilling machine 14 can drill a hole in the circuit board 42 at the pre-programmed position for that hole. After the worktable 16 is appropriately positioned, the drilling machine 14 proceeds to drill the hole to its pre-programmed depth.

After the hole is drilled, in state 316, the drilling machine 14 retracts the drill bit 42 from the hole and proceeds to a decision state 318 where it determines, based upon the drilling sequence programmed by the operator prior to the start state 300, whether the hole drilled in the state 326 is the last hole programmed to be drilled with this particular drill bit 42, i.e., the last hole of the series. If the hole drilled in state 318 is not the last hole to be drilled with this particular bit, the drilling machine 14 returns to the state 310 where the drilling machine 14 again reads the drill bit state signals provided by the sensor electronics of FIGS. 6 and 7. The drilling machine 14 then proceeds through states 310 to 318 as previously discussed. In this way, the drilling machine 14 drills all of the programmed holes for each drill bit 42 selected in state 302 or provided in state 308.

If the drilling machine 14 determines, in state 318, that the hole drilled in state 316 is the last hole programmed to be drilled with this particular drill bit 42, i.e., the last hole of this particular series of holes, the drilling machine 14 proceeds to decision state 320 where the drilling machine 14 determines, based upon the drilling sequence programmed by the operator prior to the start state 300, whether the drill bit 42 selected in the state 302 is the last drill bit 42 to be used in this programmed drilling sequence In other words, in decision state 320, the drilling machine 14 is determining whether any additional series of holes have to be drilled with a different drill bit 42.

If the drilling machine 14 determines, in decision state 320, that there is an additional series of holes to be drilled requiring an additional drill bit, then the drilling machine 14 moves to state 322 where it halts the rotation of the drill bit 42 by stopping the motor in the spindle assembly 30 (FIG. 1). From state 322, the drilling machine 14 returns to state 302 where it selects the drill bit 42 for the next series of holes in the programmed drilling sequence. For subsequently selected drill bits 42, the drilling machine 14 proceeds through states 302 through 320 until the drilling machine 14 determines, in decision state 320, that all the series of holes programmed to be drilled in this sequence are drilled and that the drill bit 42 selected in state 302 is the last drill bit 42 to be used. Thus, each of the drill bits 42 selected for the programmed automated drilling sequence will be checked by the drilling machine 14 to ensure, via the "CheckFluteLength" function performed in decision state 304, that the flute length $L_f$ of the drill bit 42 is sufficient to drill each of the holes programmed for its particular series of holes.

Figure 12:
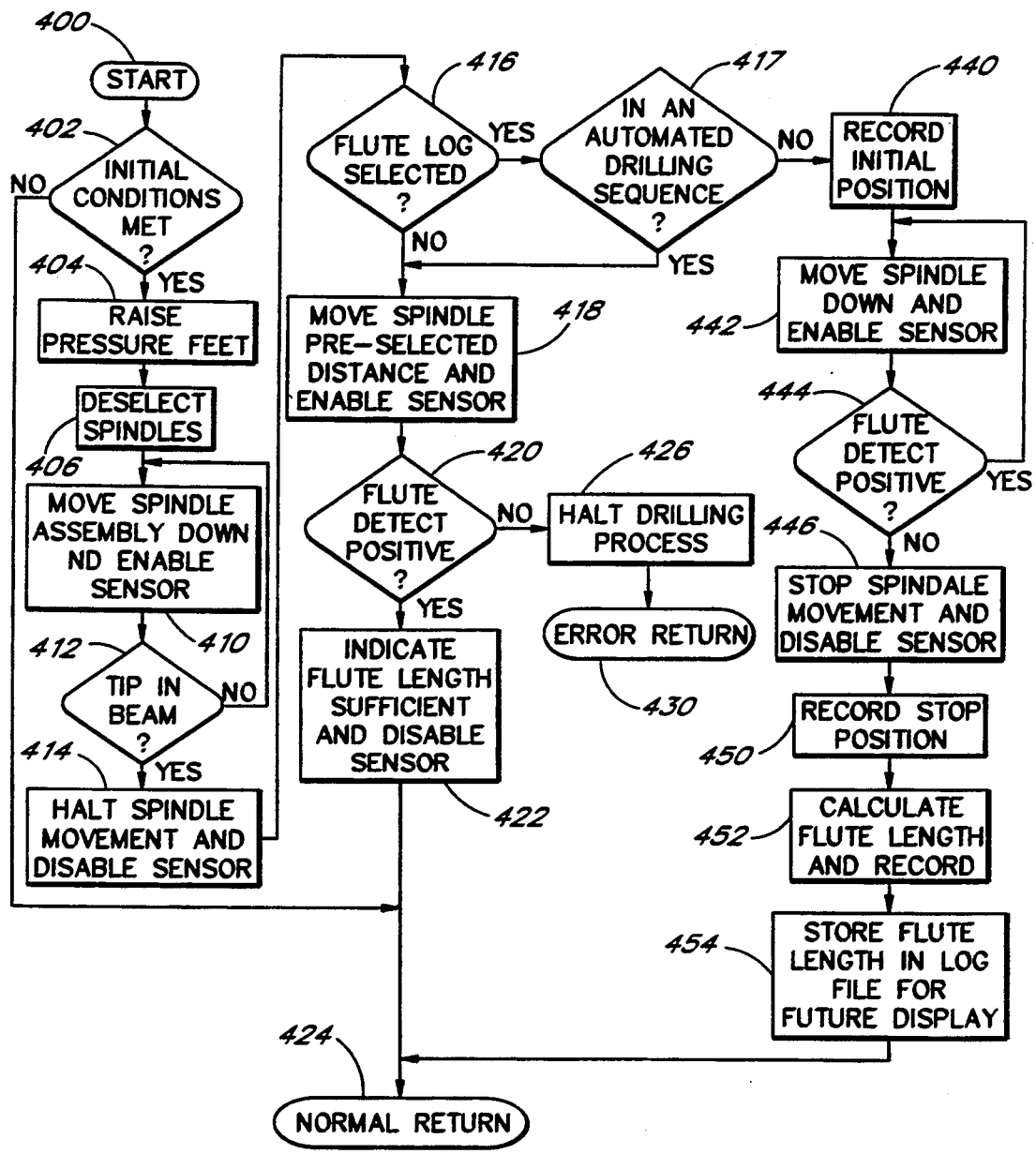
FIG. 12 is a flow diagram which illustrates the basic operation of an automated drilling machine equipped with the laser detection system of the present invention while performing a "CheckFluteLength" function during the drilling sequence of FIG. 11.

FIG. 12 is a flow diagram illustrating the operation of the automated drilling machine 14 while executing the "CheckFluteLength" function in the computer 202 (FIG. 7). This function is either called in decision state 304 during the programmed automated drilling sequence shown in FIG. 11, or the operator can manually instruct the drilling machine 14 to perform this function on a particular drill bit 42 while the drilling machine 14 is not in a programmed automated drilling sequence. The "CheckFluteLength" function verifies that the flute length $L_f$ of the selected drill bit 42 is long enough to drill the holes that the operator intends the drilling machine 14 to drill with this particular drill bit 42.

From a start state 400, the drilling machine 14 moves to a decision state 402 where it determines if a number of initial conditions necessary to perform the "CheckFluteLength" function are satisfied. In the presently preferred embodiment, these initial conditions include, when the drilling machine 14 is performing a programmed automated drilling sequence, whether the operator has specified a desired flute length $L'_f$ for this particular drill bit 42 when programming the automated drilling sequence. If the operator has not specified a desired flute length $L'_f$, the drilling machine 14 proceeds from decision state 402 directly to a normal return state 424 from which the drilling machine 14 proceeds with the programmed automated drilling sequence. Other initial conditions that must be met before the drilling machine 14 can continue the "CheckFluteLength" function include: that the drilling machine 14 is equipped with the sensor 12, that there is a drill bit in the collet 32, and, when the drilling machine 14 is a multi-spindle assembly machine, that at least one spindle 30 (FIG. 1) is selected for drilling.

If the drilling machine 14 determines, in decision state 402, that all of the initial conditions are met, the drilling machine 14 proceeds to state 404 where it raises the pressure foot assembly 34 (FIG. 1), with the attached sensor 12, off of the circuit board 44. After raising the pressure foot assembly 34, the drilling machine 14 moves to state 406 where it de-selects the spindle assembly 30 by de-energizing the solenoid valve of the coupling 25 (FIG. 1).

Figures 13A, 13B:
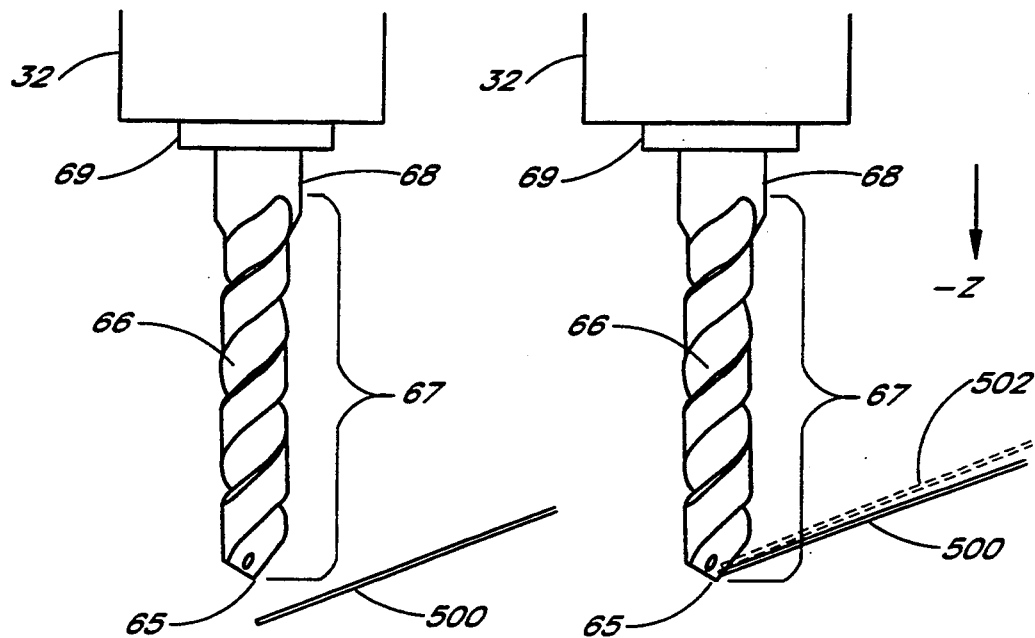
FIGS. 13a-13d are schematic diagrams which depict the relative positions of a drill bit and a laser beam of an automated drilling machine at specific intervals while performing the "CheckFluteLength" function of FIG. 12.

In the automated drilling machines 14 of the presently preferred embodiment, such as Excellon Automation's Concept 4 MVII automated drilling machine, de-selecting the spindle assembly 30 results in the drill bit 42 and the collet 32 moving in an upward direction (in the positive Z-direction, see FIG. 1) away from the circuit board approximately one to one and a half inches. Further, de-selecting the spindle assembly 30 will also result in the drill bit 42 moving in the positive Z-direction relative to the pressure foot assembly 34. As can be appreciated by reference to FIGS. 2 and 3, since the sensor 12 is mounted on the pressure foot assembly 34 and is preferably oriented so that the sensor 12 projects a laser beam near the tip 65 (FIG. 3) of the drill bit 42, de-selecting the spindle 30 also has the effect of moving the drill bit 42 above the laser beam produced by the sensor 12 such that the laser beam is no longer incident or focused upon the tip 65 of the drill bit 42. The relative positions of laser beam and the tip 65 of the drill bit 42 when the spindle assembly 30 has been de-selected is shown in FIG. 13a below.

From state 406, the drilling machine 14 proceeds to state 410 where it initiates operation of the drill vertical positioning motor 24 (FIG. 1) so that the drill bit 42 begins to move downward, or in the negative Z-direction. Further, in state 410, the drilling machine 14 also enables the sensor 12 thereby causing the sensor to generate a laser beam and the sensor electronics of FIG. 6 and 7 to sense for reflected light indicating that the laser beam is incident or focused on the tip 65 (FIG. 3) of the drill bit 42. Thereafter, the drilling machine 14 proceeds to a decision state 412 where it determines whether the tip 65 of the drill bit 42 has been moved by the motor 24 so that it is within the laser beam produced by the sensor 12. The drilling machine 14 determines that the drill bit tip 65 is within the laser beam when the sensor electronics shown in FIG. 6 detects the presence of the tip 65 of the drill bit 42 in the laser beam and generates a signal on the beam detect line 78a as previously described. If the drilling machine determines, in decision state 412, that the tip of the drill bit 42 has not yet entered the laser beam, the drilling machine 14 returns to state 410 and continues to move the drill bit 42 downwards by using the vertical positioning motor 24.

If, however, the drilling machine 14 determines in decision state 412 that the tip 65 of the drill bit 42 has entered the laser beam, then the drilling machine 14 moves to state 414 where it stops the vertical positioning motor 24 thereby halting the downward motion of the drill bit 42. The relative positions of the drill bit 42 and the laser beam produced by the sensor 12 when the tip 65 of the drill bit 42 enters the laser beam is shown in FIG. 13b, which is discussed below. Further, in state 414, the drilling machine 14, then disables the sensor 12 thereby turning the laser off. From state 414, the drilling machine 14 proceeds to a decision state 416 where it determines whether the FLUTE_LOG option, i.e., log or record the measured flute length, has been selected by the operator. The FLUTE_LOG option is an alternate method of measuring the actual flute length $L_f$ of a drill bit, and it will be explained in reference to states 440 through 462 below.

Figures 13C, 13D:
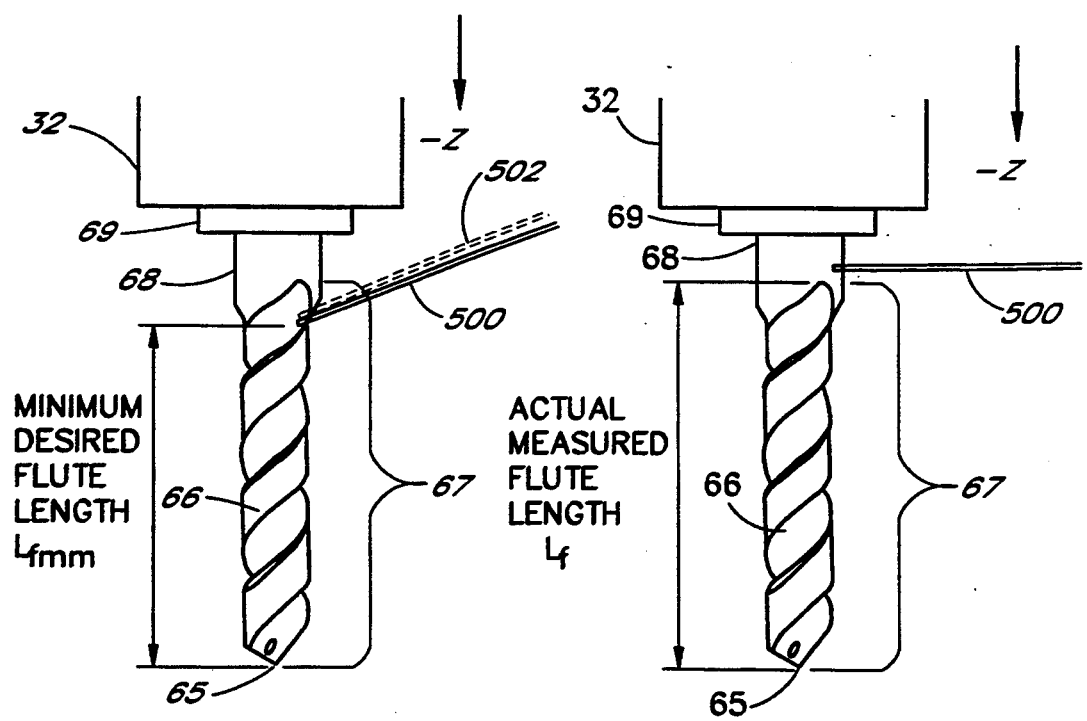

Assuming that the drilling machine 14 determines in decision state 416 that the FLUTE_LOG option has not been selected, the drilling machine 14 then proceeds to state 418. In state 418 the drilling machine 14 first moves the drill bit 42 downwards, in the negative Z-direction, a pre-selected distance, preferably equal to the minimum required flute length $L_{fmin}$, as specified by the operator for this particular drill bit 42. The drilling machine 14 then re-enable the sensor 12 thereby producing a laser beam focused on, or adjacent to, the drill bit 42. Due to the motion of the drill bit 42 relative to the stationary sensor 12, the laser beam is now preferably focused or incident on some portion of the drill bit 42 a pre-selected distance, equal to the minimum required flute length $L_{fmin}$, above the tip 65 of the drill bit 42. The relative position of the drill bit 42 and the laser beam produced by the sensor 12 is shown in FIG. 13c below.

Generally in the programmed automated drilling sequence of FIG. 11, the operator will define the pre-selected distance for each drill bit such that the desired flute length $L'_f$ of the drill bit 42 will be greater than the maximum depth of hole that this particular drill bit 42 will drill during this sequence. Alternatively, the computer 202 can incorporate software which would determine the minimum required flute length $L_{fmin}$ for a particular drill bit 42 by searching for the hole with the greatest depth to be drilled by this particular drill bit 42, and then equating the minimum required flute length $L_{fmin}$ to be equal to this depth plus some additional safety margin.

The drilling machine 14 proceeds from state 418 to a decision state 420 where it determines whether the laser beam of the sensor 12 is incident upon the fluted section 67 of the drill bit 42 (FIG. 3). As discussed above, the sensor electronics of FIG. 6 generate a positive beam detect signal on line 78a when a fluctuating light signal, indicative of the laser beam being incident upon the fluted section 67 of the drill bit 42, is detected. Such a fluctuating light signal will only be generated when the laser beam is focused on the fluted section 67 of the drill bit 42, but it is not generated when the laser beam is focused on either the shank section 68 or the collar 69 of the drill bit 42 nor the collet 32 of the drilling machine 14 as they do contain any fluted surfaces 66 (FIG. 3) necessary to generate the fluctuating signal.

If, after moving the drill bit 42 relative to the sensor 12 the pre-selected distance in state 418, a fluctuating signal is detected, the drilling machine 14 proceeds to state 422 where it first indicates to the operator, via the video display 204 (FIG. 7), that the measured flute length $L_f$ of this particular drill bit 42 is sufficient to drill the programmed holes and then the drilling machine 14 disables the sensor 12. When the fluctuating signal is detected after moving the drill bit 42 in the negative Z direction the pre-selected distance, the laser beam must then still be focused on the fluted section 67 of the drill bit 42. Hence, in this preferred embodiment, the drill bit 42 can drill into the circuit board 44 to a depth equal to this pre-selected distance without the shank section 68 of the drill bit 42 making contact with the upper surface of the circuit board 44.

The drilling machine 14 then proceed from state 422 to the normal return state 424. When the drilling machine 14 is engaged in the automated drilling sequence shown in FIG. 11, the normal return state 424 returns the drilling machine 14 to the next state of the automated drilling sequence, state 310. However, if the drilling machine 14 is not engaged in an automated drilling sequence, but is engaged in a manual operation, the normal return state 424 returns the drilling machine 14 to a "parked" position where the drilling machine 14 awaits further operator instruction before proceeding.

If, after moving the drill bit 42 (FIG. 3) the pre-selected distance in state 418, a fluctuating signal is not detected in decision state 420, then the laser beam is incident on either the shank portion 68 or the collar 69 of the drill bit 42 or it is incident the collet 32 of the drilling machine 14. In thins case, the flute length $L_f$ of the drill bit 42 is not sufficiently long enough to drill the holes programmed to be drilled by this drill bit, and use of this drill bit 42 would result in the shank portion 68 of the drill bit 42 coming in contact with, and potentially ruining, the circuit board 44 or breaking the drill bit 42. Consequently, if no fluctuating signals are detected in decision state 420, the drilling machine 14 proceeds to state 426 where the drilling machine 14 halts the drilling process. The drilling machine 14 then proceeds from state 426 to an error return state 430.

If the drilling machine 14 is engaged in the automated drilling sequence shown in FIG. 11, the error return state 430 returns the drilling machine 14 to state 306 where a message is generated on the video display 204 (FIG. 7) indicating that the flute length $L_f$ is not sufficiently long enough to drill the holes programmed for this drill bit, i.e., $L_f < L_{fmin}$. If the drilling machine 14 is engaged in manual drilling operations, the error return state 430 returns the drilling machine to a "parked" position (not shown) where the drilling machine displays a message on the video display 204 indicating that the flute length $L_f$ is not sufficiently long enough for the intended application of this drill bit 24.

It is conceivable that the flutes 66 of the drill bit 42 upon which the "CheckFluteLength" function is performed may be clogged. Hence, it may be preferable, upon obtaining a low signal from the sensor electronics of FIG. 6 on the line 78a, indicating the absence of a reflected fluctuating light signal in decision state 420 to also evaluate the signal from the sensor electronics of FIG. 7 to determine whether the flutes 66 are clogged. A signal indicative of no flute from the sensor electronics of FIG. 6 and a signal indicative of clogged flutes from the sensor electronics of FIG. 7, after having moved the drill bit 42 relative to the sensor 12 the pre-selected distance in state 418, would still mean that the flute length $L_f$ of the drill bit 42 was sufficiently long for its intended applications. Consequently, the determination as to whether the tip 65 of the drill bit 42 has entered the laser beam in decision state 412, as well as the determination of whether the laser is incident upon the fluted section 67 of the drill bit 42 in decision state 420 may also be made by reference to the signals from the sensor electronics of both FIGS. 6 and 7.

As described above, the preferred method of ensuring that the drill bit 42 has a sufficient flute length $L_f$ for its intended operation is by first moving the tip 65 of the drill bit 42 into the laser beam in state 410. Then the drill bit 42 is moved relative to the sensor 12 by the pre-selected distance, which is preferably equal to the minimum required flute length $L_{fmin}$ for this particular drill bit 42, in state 418. Then the sensor electronics shown in FIG. 6, or alternatively of FIGS. 6 and 7, is then used to determine whether the laser is still incident upon the fluted section 67 of the drill bit 42 based upon whether a fluctuating signal is detected in decision state 420.

However if, in the decision state 416, the FLUTE__LOG function is selected, an alternative method of determining whether the flute length $L_f$ of the drill bit 42 is sufficient for its intended application is used by the drilling machine 14. In this preferred embodiment, access to the FLUTE_LOG function is limited to personnel who have been given a specific password and it is Used primarily in a maintenance capacity as a means for verifying the accuracy of the flute length detection system of the drilling machine 14 or measuring actual flute lengths $L_f$ of drill bits.

Further, in this preferred embodiment, when the drilling machine is engaged in an automated drilling sequence, like the sequence shown in FIG. 11, the drilling machine 14 will not perform the FLUTE_LOG function. Hence, when the FLUTE_LOG function is selected in decision state 416 by a person having an appropriate password, the drilling machine 14 then moves to a decision state 417 where the drilling machine 14 determines whether it is engaged in an automated drilling sequence. If the drilling machine is engaged in an automated drilling sequence, the drilling machine 14 returns from decision state 417 to state 418 where it moves the drill bit 42 relative to the sensor the pre-selected distance.

If, however, the drilling machine 14 is not engaged in an automatic drilling sequence, and the operator has selected the FLUTE_LOG function, the drilling machine then moves to state 440 where the position of the tip 65 of the drill bit 42 on the Z-axis, at the point where it was determined in decision state 412 that the laser beam was incident on the tip 65 of the drill bit 42, is recorded in a memory file within the computer 202 (FIG. 7). Circuit board automated drilling machines are typically equipped with a highly accurate positioning system for positioning the drill bit 42 in the X, Y and Z planes. Hence, the drilling machine 14 determines the Z-axis location in state 440 by simply retrieving the current Z-axis position of the drill bit 42 after the spindle and drill bit 42 have been stopped in state 414.

From state 440, the drilling machine 14 then moves to state 442 where the vertical positioning motor 24 (FIG. 1) is engaged to move the spindle assembly 30 and the drill bit 42 downward and the sensor 12 is enabled to thereby generate a laser beam on the fluted section 67 (FIG. 3) of the drill bit 42. After initiating the motor 24 and enabling the sensor 12, the drilling machine 14 proceeds to a decision state 444 where it determines whether the sensor electronics of FIG. 6 and 7 are still detecting a reflected fluctuating signal indicative of the laser beam being focused upon the fluted section 67 of the drill bit 42. If the drilling machine 14, in decision state 444, still detects this fluctuating signal, the drilling machine 14 returns to state 442 where it continues to engage the motor 24 to move the spindle assembly 30 and the drill bit 42 downward.

However, if, in decision state 444, the sensor detects no reflected fluctuating signal indicative of the laser beam being focused upon the fluted section 67 of the drill bit 42 is detected, the drilling machine 14 moves to state 446 where it stops the motor 24 and disables the sensor 12 thereby halting the downward motion of the spindle 30 and the drill bit 42 and turning off the laser beam. Typically, the first point at which the sensor 12 will no longer receive a fluctuating reflected signal from the drill bit 42 during the FLUTE_LOG function occurs when the laser beam is incident on the shank section 68 of the drill bit 42 at a point immediately adjacent to the fluted section 67. The relative positions of the drill bit 42 and the laser beam produced by the sensor 12 at this position is shown in FIG. 13d below.

The drilling machine 14 then proceeds from state 446 to state 450 where the drilling machine 14 determines and records the position of the drill bit 42 on the Z-axis where the laser beam is no longer incident on the fluted section 67. The determination and recording of the position of the drill bit 42 when the laser was no longer incident upon the fluted section 67 is performed in the same fashion as the position of the tip 65 was recorded in state 440.

From the state 446, the drilling machine 14 proceeds to calculate the actual flute length $L_f$ in state 452 by obtaining the difference between the position of the drill bit 42 when the tip 65 entered the laser beam of the sensor 12, recorded in state 440, and the position of the drill bit 42 when the laser beam of the sensor 12 ceased to be incident upon the fluted section 67 of the drill bit 42, recorded in state 450. This calculation yields the actual length of the fluted section 67, or the flute length $L_f$ (FIG. 3), of the drill bit 42. This length is then stored in a file in the memory of the computer 202 corresponding to this particular spindle assembly 30 for future display and reference in state 454. From state 454, the drilling machine proceeds to the normal return state 424. Since, in this preferred embodiment, the drilling machine 14 can only perform the FLUTE_LOG function when it is not engaged in an automated drilling sequence, the normal return state 424 returns the drilling machine to a "parked" position after performing the FLUTE_LOG function where it awaits further commands by the operator.

As described above, the sensor electronics of FIG. 6 and 7 can be used to ensure that the drill bit intended to be used and selected by the drilling machine 14, or by the operator, has a sufficiently long flute length $L_f$ to drill holes to the appropriate depths without risking damage to the circuit board or the drill bit. Computer source code performing the "CheckFluteLength" function, of which the flow chart shown in FIG. 12 is a functional equivalent, is entitled tmsflute.c and is attached herewith in the accompanying Microfiche Appendix.

Turning to FIGS. 13a through 13d, the relative positions of the drill bit 42 to a laser beam 500 generated by the sensor 12 (FIG. 2) during the "CheckFluteLength" function are shown. Referring specifically to FIG. 13a, the relative positions of the drill bit 42 and the laser beam 500 are shown when the drilling machine is in state 410 (FIG. 12), after the spindle assembly 32 has been deselected. As can be seen, the tip 65 of the drill bit 42 is above a laser beam 500 generated by the sensor 12, hence the sensor 12 will not detect any fluctuating signal indicative of the laser beam being focused on the fluted section 67 of the drill bit 42.

FIG. 13b illustrates the relative positions of the drill bit 42 and the laser beam 500 after state 410 (FIG. 12) when the spindle assembly 30 (FIG. 1) has been moved down, in the negative Z direction, by the positioning motor 24. As can be seen, the drill bit 42 and the laser beam 500 are now relatively positioned at a point where the laser beam 500 is being reflected off the tip 65 of the drill bit 42. A reflected beam 502, is then detected by the sensor 12 in decision state 412 (FIG. 12).

FIG. 13c illustrates the relative positions of the drill bit 42 and the laser beam 500 after state 418 (FIG. 12) when the drill bit 42 has been moved the pre-selected distance, preferably equal to the minimum desired flute length $L_{fmin}$. The "CheckFluteLength" function shown in FIG. 12, would return a positive flute detect in decision state 420 for the relative positions of the drill bit 42 and the laser beam 500 shown in FIG. 13c as the laser beam 500 is still incident on the fluted section 67 resulting in the reflected beam 502 being detected by the sensor 12 (FIG. 2). However, if the laser beam was incident upon the shank section 68, there would be no reflected beam 502 as the shank section 68 does not have any flutes 66 to generate the fluctuating signal.

FIG. 13d illustrates the relative positions of the drill bit 42 and the laser beam 500 in decision state 444 (FIG. 12) at the point where the drilling machine 14 is no longer sensing the fluted section 67 of the drill bit 42. As shown, the laser beam 500 is incident on the shank section 68 of the drill bit 42 at a point immediately adjacent to the fluted section 67. Consequently, there is no reflected fluctuating light signal 502 generated. By measuring the difference between the Z position of the drill bit 42 when the tip 65 enters the laser beam 500 as detected in state 412 (FIG. 13b) and the Z position of the drill bit 42 when the sensor 12 is no longer receiving the fluctuating light signal 502 in decision state 444 (FIG. 13d), the actual flute length $L_f$ of the drill bit 42 can be calculated.

Although the foregoing discussion details one preferred embodiment of a system for ensuring that a drill bit has a sufficient flute length $L_f$ for its intended application, a person skilled in the relevant technology will understand that various substitutions in the implementation of the invention can occur without departing from the scope of the invention. For example, the foregoing discussion indicates that the relative movement between the sensor 12 and the drill bit 42 is accomplished by moving the drill bit 42 along the Z axis via the coupling 25 and the vertical positioning motor 24 (FIG. 1).

It will also be understood, an equivalent structure for obtaining relative motion between the sensor 12 and the drill bit 42 can be achieved by moving the sensor 12 relative to a stationary drill bit 42. In the above-described preferred embodiment, the sensor 12 is mounted on the pressure foot 34 which can be moved in the positive and negative Z directions via the pressure bearing piston and cylinder assemblies 38, 40 (FIG. 1). By modifying the existing mechanism for positioning the pressure foot assembly 34 such that precise Z axis positioning of the pressure foot assembly 34 can be attained, the relative movement between the sensor 12 coupled to the pressure foot assembly 34 and the drill bit 42 can be attained by moving the sensor 12 instead of the drill bit 42.

Having described a preferred embodiment of the invention, it will be further apparent to those skilled in the art that it will have many applications. For example, the it can be used to detect the state of any machine member which oscillates upwardly and downwardly in a single plane by sensing and detecting a reflected light beam which reflects off the surface of the member in a frequency related to the frequency of oscillations. Also, when detecting movement of non-reflective surfaces, a reflective tape can be used and the laser beam focused to detect reflections from the reflective tape. It will also be observed that the particular function of the embodiment may be changed by for example, converting the detection to the frequency domain, so long as the second order effects of the amplified signal are detected. All such modifications and variations are intended to be within the scope of the appended claims.

We claim:

1. A sensor for detecting characteristics of a rotating drill bit having flutes, comprising:
   a laser for generating laser light;
   means for focusing the laser light on the rotating drill bit;
   means for sensing light reflected from the flutes of the rotating drill bit;
   movement means for moving the rotating drill bit from a first position where the laser light is focused on the tip of the rotating drill bit, to a second position where the laser light is focused on the rotating drill bit a pre-selected distance from the tip of the rotating drill bit; and
   signal means, connected to the sensing means, for indicating the presence of flutes, at the second position.

2. The sensor of claim 1, wherein the means for focusing the laser light on the rotating drill bit comprises at least one focusing lens and the means for sensing light reflected from the flutes of the rotating drill bit comprises a photodiode.

3. The sensor of claim 1, wherein the movement means comprises a vertical positioning motor of a drilling machine which moves the rotating drill bit relative to the energy source.

4. The sensor of claim 1, wherein the signal means comprises a filtering circuit, which filters non-fluctuating signals from said sensor means, and a comparator.

5. A sensor for detecting characteristics of a rotating drill bit having flutes and a shank section, comprising:
   an energy source for generating energy;
   means for focusing energy from the energy source on the rotating drill bit;
   means for detecting energy reflected from the fluted section of the rotating drill bit;
   means for inducing relative motion between the rotating drill bit and the energy source; and
   means, responsive to signals from the means for detecting energy, for determining length characteristics of the fluted section of the rotating drill bit.

6. The sensor of claim 2, wherein the means for determining length characteristics of the fluted section determines whether the length of the fluted section of the drill bit is greater than a pre-defined minimum flute length comprising the flute length of the drill bit needed to permit flute extension to a selected depth within material being drilled while preventing contact between the shank of the drill bit and the material being drilled.

7. The sensor of claim 2, wherein the energy source comprises a laser and the means for detecting energy includes a photodiode.

8. The sensor of claim 2, Wherein the means for inducing relative motion comprises a vertical positioning motor of a drilling machine which moves the rotating drill bit relative to the energy source.

9. The sensor of claim 8, wherein the means for inducing relative motion induces relative motion between the rotating drill bit and the energy source from a first relative position, where energy generated by the energy source is not focused on the drill bit, to a second relative position where energy generated by the energy source is focused at a first location on the rotating drill bit immediately adjacent to the tip of the drill bit, and then to a third relative position where energy is focused on a second location on the drill bit, a pre-selected distance from the first location.

10. The sensor of claim 9, wherein the pre-selected distance is equal to the pre-defined minimum flute length.

11. The sensor of claim 10, wherein the means for determining the length characteristics of the fluted section of the drill bit determines that the flute length of the rotating drill bit is equal to, or greater than, a pre-defined minimum flute length when the drill bit and the energy source are in the third relative position and the means for detecting energy detects energy reflected from the flutes of the rotating drill bit.

12. The sensor of claim 6, wherein energy from the energy source is initially focused at a first location on the fluted section of the rotating drill bit adjacent a first end of the fluted section of the drill bit, and wherein the means for inducing relative motion induces relative motion between the drill bit and the energy source so that the energy is continuously focused on the fluted section of the rotating drill bit from the first location to a second location substantially adjacent a second end of the fluted section of the rotating drill bit.

13. The sensor of claim 12, wherein the means for inducing relative motion halts the relative motion between the drill bit and the energy source, so that the energy is focused on the second location, in response to the sensing means detecting no reflected energy from the flutes of the rotating drill bit.

14. The sensor of claim 13, wherein the means for determining length characteristics of the rotating drill bit determine the length of the fluted section of the drill bit based at least in part on signals indicative of the relative positions of the drill bit and energy source when energy is focused at the first and second locations.

15. A system for determining linear dimensions of an object in continuous rotational motion having regions of different surface characteristics comprising:
an energy source for generating energy;
a sensor for sensing energy reflected off the object in continuous rotational motion, wherein the sensor senses an energy signal which fluctuates, due to the continuous rotational movement of the object, when the energy is reflected off of a first region of the object having a first surface characteristic;
a signal processor, responsive to information received from the sensor, for providing a first signal indicative of the first surface characteristic of the object in continuous rotational motion, and a second signal indicative of a second surface characteristic of the object in continuous rotational motion;
a computer, receiving the first and second signals indicative of the surface characteristics of the object in continuous rotational motion, which determines a length dimension of the first region of the object containing the first surface characteristic; and
a system, responsive to signals from the computer for inducing the energy from the energy source to be focused on different relative positions on the object.

16. The system of claim 15, wherein the energy source includes a laser and the sensor includes a photodiode.

17. The system of claim 15, wherein the system for inducing the energy from the energy source to be focused on different relative positions on the object comprises a movable surface which moves the energy source relative to the object in response to signals generated by the computer.

18. The system of claim 15, wherein the system for inducing the energy from the energy source to be focused on different relative positions on the object comprises an apparatus coupled to the object in continuous motion which moves the object relative to the energy source.

19. The system of claim 15, wherein the object in continuous motion is a rotating drill bit having a tip, a fluted section of a first surface characteristic and a shank section of a second surface characteristic.

20. The system of claim 19, wherein the system which induces the energy from the energy source to be focused on different relative positions, induces the energy to be focused on a first location substantially adjacent one end of the fluted section of the drill bit, and then induces the energy to be focused on a second location on the drill bit a pre-selected distance from the first location.

21. The system of claim 20, wherein the pre-selected distance from the first location is equal to a pre-defined minimum flute length, such that the fluted section of the drill bit has a length dimension greater than the pre-defined minimum flute length when the signals from the signal processor, indicative of the surface characteristics at the first and second locations, are indicative of the first surface characteristic.

22. The system of claim 21, wherein the first location is substantially adjacent to the tip of the rotating drill bit.

23. The system of claim 19, wherein the energy is initially focused at a first location, substantially at a first end of the fluted section of the drill bit, and wherein the system which induces the energy from the energy source to be focused on different relative positions, induces relative motion between the drill bit and the energy source so that the energy is continuously focused on the fluted section from the first location to a second location on the rotating drill bit, substantially adjacent to the second end of the fluted section of the rotating drill bit.

24. The system of claim 23, wherein the system which induces the energy from the energy source to be focused on different locations on the drill bit halts the relative motion between the drill bit and the energy source so that the energy is focused on the second location in response to the signal processor providing a signal indicative of the second surface characteristic of the drill bit.

25. The system of claim 24, wherein the computer determines the length of the fluted section of the rotating drill bit by determining the amount of relative motion induced between the drill bit and the energy source between the first and second locations based at least in part on signals received from the movement system.

26. A sensor for detecting characteristics of a rotating drill bit having a tip, a fluted section, and a shank section, comprising:
a laser light source for generating laser light;
a focusing system for focusing the laser light on the rotating drill bit;
a sensor responsive to light reflected from the fluted section of the rotating drill bit for producing signals representative of surface characteristics of the rotating drill bit;
a first signal processor, receiving signals from the sensor, for indicating the presence of the drill bit;
a second signal processor, receiving signals from the sensor, for indicating clogged flutes in the drill bit;

a system to for inducing relative movement between the drill bit and the laser light source; and a computer, responsive to signals from the first signal processor and from the second signal processor, for providing a first state of the drill bit wherein the first state is at least one of: drill bit present and clean, drill bit present and clogged; the computer further responsive to signals from the system for inducing relative movement, and providing a second state of the drill bit wherein the second state is either a drill bit with sufficient flute length or a drill bit having insufficient flute length.

27. A method of ensuring a drill bit, having a tip, a fluted section, and a shank section, has a sufficient flute length for a drilling application, the method comprising the steps of:

inducing a first relative movement between the drill bit and a light source so that light is focused on a first location on the drill bit, wherein the first location is located substantially at one end of the fluted section of the drill bit;

receiving light reflected from the first location of the drill bit;

processing the light received from the first location so as to generate a first signal indicative of the drill bit characteristics detected from the received light;

inducing a second relative movement between the drill bit and the light source so that the light is focused on the drill bit at a second location which is a pre-selected distance from the first location;

receiving light reflected from the second location of the drill bit;

processing light received from the second location so as to generate a second signal indicative of the drill bit characteristics detected from the received light; and determining that the drill bit has a sufficient flute length when the second signal indicates that the light is incident on the fluted section of the drill bit.

28. The method defined in claim 27, wherein the first location of the drill bit is located substantially adjacent to the tip of the drill bit.

29. The method defined in claim 27, wherein the pre-selected distance is equal to the minimum flute length required for the drill bit to have a sufficient flute length of the intended drilling application.

30. A method of measuring the length of a selected section of a tool wherein the selected section has a substantially uniform surface characteristic comprising the steps of:

inducing a first relative movement between the tool and an energy source so that energy is incident on a first location of the tool, wherein the first location is located substantially at one end of the selected section of the tool;

receiving energy reflected from the first location of the tool;

processing the energy reflected from the first location of the tool to thereby generate a first signal indicative of the reflected energy;

inducing a second relative movement between the tool and the energy source so that energy is incident over a substantially continuous path along the selected section of the tool;

receiving energy reflected from the substantially continuous path on the selected section of the tool;

processing the energy reflected from the continuous path of the selected section of the tool to thereby generate a second signal indicative of the reflected energy;

halting the second relative movement between the tool and the energy source when the second signal indicative of the energy reflected from the continuous path indicates that energy from the energy source is no longer incident upon the selected section of the tool; and determining the length of the selected section based at least in part on the distance of the second relative movement.

31. The method defined in claim 30, wherein the tool is a drill bit and the selected section is the fluted section of the drill bit.

32. The method defined in claim 30, wherein the first and second relative movements between thee tool and the energy source are provided by moving the energy source relative to the tool.

33. A method of determining that a selected section of a tool having a substantially uniform surface characteristic has a length greater than a pre-selected minimum length comprising the steps of:

inducing a first relative movement between the tool and an energy source so that energy is incident on a first location of the tool, wherein the first location is located substantially at one end of the selected section of the tool;

receiving energy reflected from the first location of the tool;

processing the energy reflected from the first location of the tool so as to generate a first signal indicative of the reflected energy;

inducing a second relative movement between the tool and the energy source so that energy is incident on the tool at a second location a pre-selected distance, substantially equal to the pre-selected minimum length, from the first location;

receiving energy reflected from the second location of the tool;

processing the energy reflected from the second location of the tool so as to generate second signal indicative of the reflected energy; and determining that the length of the selected section is equal to or greater than the pre-determined minimum length when the second signal is indicative of the energy being reflected from the selected portion of the tool.

34. The method defined in claim 33, wherein the tool is a drill bit and the selected section is the fluted section of the drill bit.

35. The method defined in claim 33, wherein the first and second relative movements between the tool and the energy source is provided by moving the energy source relative to the tool.

* * * * *